(12) United States Patent
Park et al.

(10) Patent No.: US 12,733,362 B2
(45) Date of Patent: Sep. 8, 2026

(54) DISPLAY APPARATUS

(71) Applicant: Samsung Display Co., LTD., Yongin-si (KR)

(72) Inventors: Junhyeong Park, Yongin-si (KR); Kyungmin Kim, Yongin-si (KR); Seongwon Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 344 days.

(21) Appl. No.: 18/607,847

(22) Filed: Mar. 18, 2024

(65) Prior Publication Data

US 2024/0324359 A1 Sep. 26, 2024

(30) Foreign Application Priority Data

Mar. 24, 2023 (KR) ........................ 10-2023-0039070
Jul. 26, 2023 (KR) ........................ 10-2023-0097698

(51) Int. Cl.
*H10K 59/131* (2023.01)
*H10K 102/00* (2023.01)

(52) U.S. Cl.
CPC ..... *H10K 59/131* (2023.02); *H10K 2102/311* (2023.02)

(58) Field of Classification Search
CPC .................................................... H10K 59/131
See application file for complete search history.

(56) References Cited

U.S. PATENT DOCUMENTS

| | | | | |
|---|---|---|---|---|
| 9,791,989 | B2 | 10/2017 | Hong et al. | |
| 10,430,007 | B2 | 10/2019 | Hong et al. | |
| 11,683,968 | B2 * | 6/2023 | Hong | H10K 59/353 257/40 |
| 2016/0293571 | A1 * | 10/2016 | Yoon | H10K 59/95 |
| 2020/0051964 | A1 * | 2/2020 | Jung | H10K 59/131 |
| 2020/0212117 | A1 * | 7/2020 | Jeon | H10W 90/00 |
| 2020/0312248 | A1 * | 10/2020 | Shin | G09G 3/3266 |
| 2021/0375835 | A1 * | 12/2021 | Kang | H10K 59/131 |

(Continued)

FOREIGN PATENT DOCUMENTS

| | | |
|---|---|---|
| CN | 111162106 B | 9/2022 |
| KR | 1020160130062 A | 11/2016 |

(Continued)

*Primary Examiner* — Steven M Page
(74) *Attorney, Agent, or Firm* — CANTOR COLBURN LLP

(57) ABSTRACT

A display apparatus includes: a substrate including main islands arranged in a first direction and a second direction, a first connecting unit configured to connect the main islands arranged in the first direction to one another, a second connecting unit configured to connect the main islands arranged in the second direction to one another, a first sub-island in a middle portion of the first connecting unit, a second sub-island in a middle portion of the second connecting unit, and a plurality of through-portions defined between the main islands; a first pixel circuit, a second pixel circuit, and a third pixel circuit on the main islands; a first light-emitting element on the first sub-island and connected to the first pixel circuit; a first connection wiring on the first connecting unit and configured to connect the first pixel circuit to the first light-emitting element; and first wirings on the first connecting unit.

25 Claims, 25 Drawing Sheets

(56) References Cited

U.S. PATENT DOCUMENTS

| | | | | |
|---|---|---|---|---|
| 2022/0013609 | A1* | 1/2022 | Won | H10K 59/122 |
| 2022/0085130 | A1 | 3/2022 | Zhai | |
| 2023/0397479 | A1 | 12/2023 | Xue et al. | |

FOREIGN PATENT DOCUMENTS

| | | | |
|---|---|---|---|
| KR | 1020200017336 | A | 2/2020 |
| KR | 1020200081220 | A | 7/2020 |
| KR | 1020200115772 | A | 10/2020 |
| KR | 1020210094508 | A | 7/2021 |
| WO | 2022133711 | A1 | 6/2022 |

* cited by examiner

ED1
ED3
330
320
310
223
222
221
215
213
211
209
202
300
OLED
WL1
CWL1
CM1
105a
(105)
V
PL2
PL1
PL
Act
DE
CE1
CE2
Cst
TFT
SE
GE
PC
101
320(320u)
CM'
CM3
207
205
203
201
100
IL
I
I'

FIG. 14

DISPLAY APPARATUS

This application claims priority to Korean Patent Application No. 10-2023-0039070, filed on Mar. 24, 2023, and Korean Patent Application No. 10-2023-0097698, Jul. 26, 2023, and all the benefits accruing therefrom under 35 U.S.C. § 119, the contents of which in their entirety are herein incorporated by reference.

BACKGROUND

1. Field

One or more embodiments relate to a display apparatus, and more particularly, to a stretchable display apparatus.

2. Description of the Related Art

As a display apparatus that visually displays electrical signals has been developed, various display apparatuses having excellent characteristics such as thin shape, light weight, and low power consumption have been introduced. For example, a flexible display apparatus that may be folded or rolled up has been introduced. Research and development on a stretchable display apparatus that may be changed into various shapes has been actively conducted.

SUMMARY

One or more embodiments provide a structure of a display apparatus, for example, a structure of a stretchable display apparatus.

Additional aspects will be set forth in part in the description which follows and, in part, will be apparent from the description, or may be learned by practice of the presented embodiments.

According to one or more embodiments, a display apparatus includes: a substrate including main islands arranged in a first direction and a second direction, a first connecting unit configured to connect the main islands arranged in the first direction to one another, a second connecting unit configured to connect the main islands arranged in the second direction, to one another a first sub-island located in a middle portion of the first connecting unit, a second sub-island located in a middle portion of the second connecting unit, and a plurality of through-portions defined between the main islands; a first pixel circuit, a second pixel circuit, and a third pixel circuit located on each of the main islands; a first light-emitting element located on the first sub-island and connected to the first pixel circuit; a first connection wiring located on the first connecting unit and configured to connect the first pixel circuit to the first light-emitting element; and first wirings located on the first connecting unit.

The display apparatus may further include: a second light-emitting element located on the second sub-island and connected to the second pixel circuit, and a third light-emitting element located on each of the main islands and connected to the third pixel circuit, wherein the first light-emitting element, the second light-emitting element, and the third light-emitting element emit light of different colors from each other.

A size of a third sub-pixel implemented by the third light-emitting element may be greater than a size of a first sub-pixel implemented by the first light-emitting element in a plan view.

The third light-emitting element may at least partially overlap the first pixel circuit in the plan view.

The first connecting unit may include: a first portion convex in a third direction and a second portion convex in a fourth direction opposite to the third direction in the plan view, where the first sub-island may be located between the first portion and the second portion.

The display apparatus may further include second wirings located on the second connecting unit, where the first wirings and the second wirings may be located in the same layer.

At least one of the first wirings may be a scan line through which a scan signal is transmitted, and at least one of the second wirings may be a data line through which a data signal is transmitted.

The display apparatus may further include: a first power voltage line located on each of the main islands, the first connecting unit, and the second connecting unit, where the first connection wiring and the first power voltage line are located in the same layer.

The display apparatus may further include: a second light-emitting element located on the second sub-island and connected to the second pixel circuit; second wirings configured to provide a data signal to the first pixel circuit, the second pixel circuit, and the third pixel circuit; and a second connection wiring located on the second connecting unit and configured to connect the second pixel circuit to the second light-emitting element, where the second connection wiring and the second wirings may be located in the same layer.

The display apparatus may further include: a second power voltage line located on each of the main islands, the first connecting unit, and the second connecting unit, where a contact area where the second power voltage line and a second electrode of the first light-emitting element are connected to each other may be located on the first connecting unit.

The first light-emitting element may be an organic light-emitting element.

The first light-emitting element may be a micro-light-emitting element.

The display apparatus may further include a first sub-light-emitting element connected to the first pixel circuit and configured to emit light of the same color as the first light-emitting element, where the first sub-light-emitting element may be located on each of the main islands.

The first connection wiring may include a 1-1 connection wiring and a 1-2 connection wiring located in different layers from each other in the first connecting unit.

The display apparatus may further include: a second power voltage line located on each of the main islands, the first connecting unit, and the second connecting unit, where the first connection wiring and the second power voltage line may be located in the same layer.

The first connection wiring and a first electrode of the first light-emitting element may be located in the same layer.

A plurality of third light-emitting elements configured to emit light of the same color may be provided on each of the main islands.

The first light-emitting element may be provided in plurality, and the plurality of first light-emitting elements may be configured to emit light of the same color.

The display apparatus may further include an optical functional layer located on the first light-emitting element, where the optical functional layer may include a color conversion layer overlapping the first light-emitting element and a light blocking unit overlapping the first connecting unit in the plan view.

The color conversion layer may include quantum dots.

According to one or more embodiments, a display apparatus includes: a substrate including a main island, a sub-island spaced apart from the main island, a connecting unit configured to connect the main island to the sub-island, and a plurality of through-portions defined between the main island the sub-island; a first pixel circuit and a second pixel circuit located on the main island; a first light-emitting element located on the main island and at least partially overlapping the first pixel circuit and the second pixel circuit in a plan view; and a second light-emitting element located on the sub-island and connected to the second pixel circuit.

A color of a first sub-pixel implemented by the first light-emitting element and a color of a second sub-pixel implemented by the second light-emitting element may be different from each other, and a size of the first sub-pixel may be greater than a size of the second sub-pixel in the plan view.

The connecting unit may include a curved portion.

The display apparatus may further include a second sub-light-emitting element located on the main island and connected to the second pixel circuit.

An area of the sub-island may be less than an area of the main island in the plan view.

BRIEF DESCRIPTION OF THE DRAWINGS

The above and other aspects, features, and advantages of certain embodiments will be more apparent from the following description taken in conjunction with the accompanying drawings, in which:

FIG. 14 is a cross-sectional view schematically illustrating a display apparatus, according to another embodiment;

DETAILED DESCRIPTION

Figure 1:
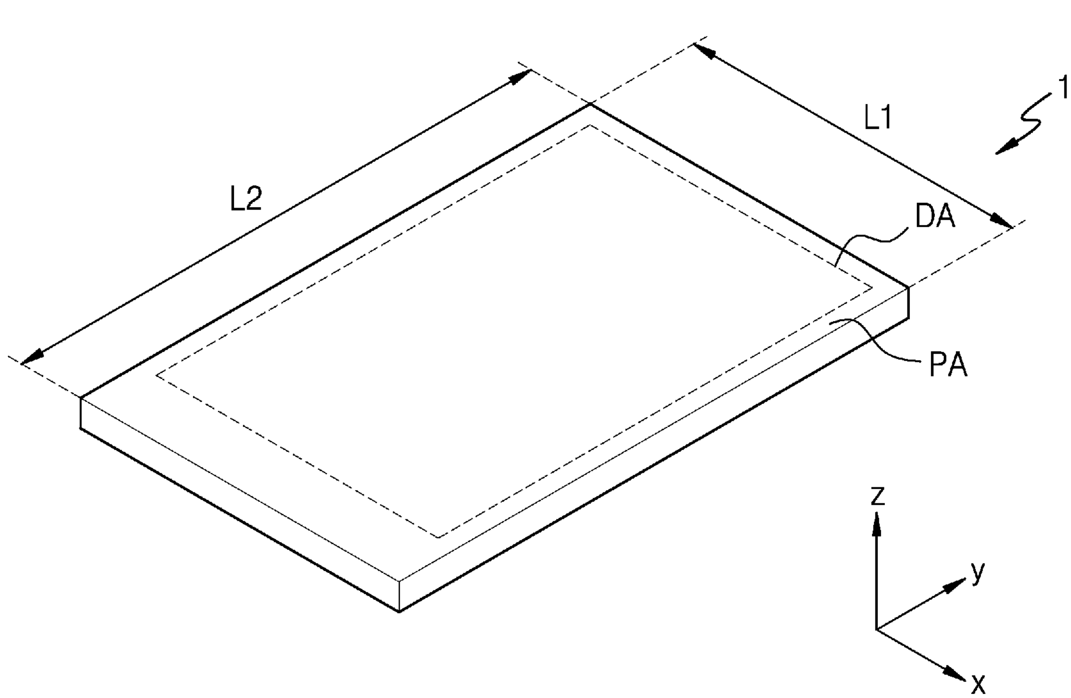
FIG. 1 is a perspective view schematically illustrating a stretchable display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

"A and/or B" is used herein to select only A, select only B, or select both A and B. "At least one of A or B" is used to select only A, select only B, or select both A and B.

It will be understood that when a layer, a region, or a component is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or a component is referred to as being "electrically connected," it may be directly electrically connected, and/or may be indirectly electrically connected with intervening layers, regions, or components therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2A:
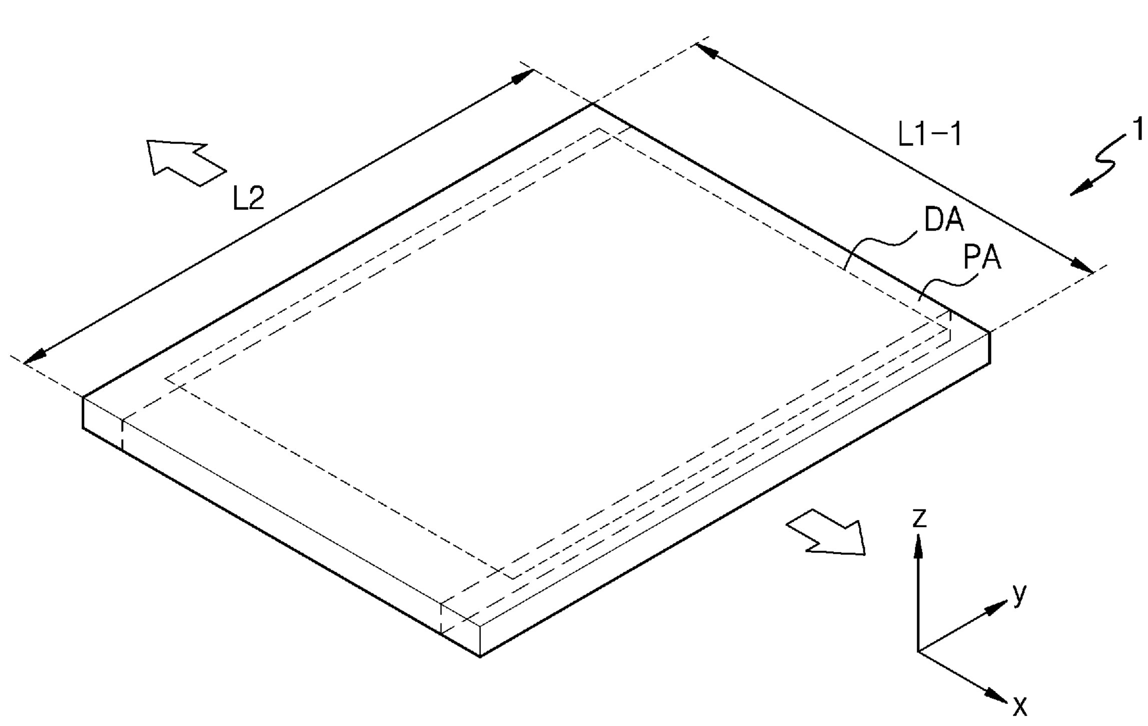
FIG. 2A is a perspective view illustrating a first state in which the display apparatus of FIG. 1 is stretched in a first direction.
Figure 2B:
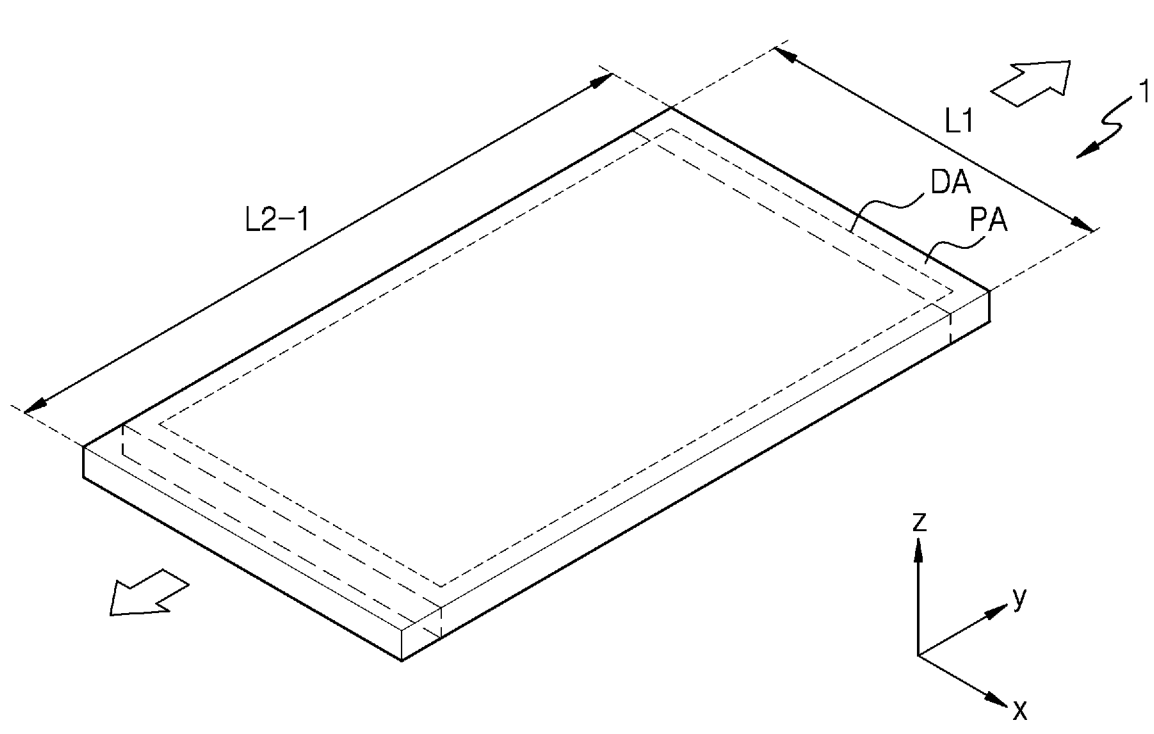
FIG. 2B is a perspective view illustrating a second state in which the display apparatus of FIG. 1 is stretched in a second direction.

FIG. 1 is a perspective view schematically illustrating a display apparatus 1, according to an embodiment. FIG. 2A is a perspective view illustrating a first state in which the display apparatus 1 of FIG. 1 is stretched in a first direction. FIG. 2B is a perspective view illustrating a second state in which the display apparatus 1 of FIG. 1 is stretched in a second direction.

Referring to FIG. 1, the display apparatus 1 may include a display area DA and a peripheral area PA. The display area DA may include a plurality of sub-pixels. The display apparatus 1 may provide a certain image by using light emitted from the plurality of sub-pixels. The peripheral area PA may be adjacent to the display area DA. In an embodiment, the peripheral area PA may surround the entirety of the display area DA.

The display apparatus 1 may include a first side L1 extending in the first direction and a second side L2 extending in the second direction. The first side L1 and the second side L2 may be edges of the display apparatus 1. The first direction and the second direction may intersect each other. For example, an acute angle may be formed between the first direction and the second direction. Alternatively, an obtuse angle or a right angle may be formed between the first direction and the second direction. The following will be described assuming that the "first direction" is an x direction or a −x direction and the "second direction" is a y direction or a −y direction.

The display apparatus 1 that is a stretchable display apparatus may be stretched in the first direction (e.g., the x direction or the −x direction) when a tensile force is applied to the display apparatus 1 in the first direction (e.g., the x direction or the −x direction), as shown in FIG. 2A. In this case, a first side L1-1 of FIG. 2A may be greater than the first side L1 of FIG. 1. Each of the display area DA and the peripheral area PA may be stretched in the first direction (e.g., the x direction or the −x direction). In another embodiment, the display apparatus 1 may be contracted in the first direction (e.g., the x direction or the −x direction) when a contraction force is applied to the display apparatus 1 in the first direction (e.g., the x direction or the −x direction). In this case, the first side L1-1 of FIG. 2A may be less than the first side L1 of FIG. 1. Each of the display area DA and the peripheral area PA may be contracted in the first direction (e.g., the x direction or the −x direction).

Referring to FIG. 2B, the display apparatus 1 may be stretched in the second direction (e.g., the y direction or the −y direction) when a tensile force is applied to the display apparatus 1 in the second direction (e.g., the y direction or the −y direction). In this case, a second side L2-1 of FIG. 2B may be greater than the second side L2 of FIG. 1. Each of the display area DA and the peripheral area PA may be stretched in the second direction (e.g., the y direction or the −y direction). In another embodiment, the display apparatus 1 may be contracted in the second direction (e.g., the y direction or the −y direction) when a contraction force is applied to the display apparatus 1 in the second direction (e.g., the y direction or the −y direction). In this case, the second side L2-1 of FIG. 2B may be less than the second side L2 of FIG. 1. Each of the display area DA and the peripheral area PA may be contracted in the second direction (e.g., the y direction or the −y direction). As such, when a tensile force or a contraction force is applied to the display apparatus 1, the display apparatus 1 may be changed into various shapes.

Although the display apparatus is stretched or contracted in an xy plane in FIGS. 2A and 2B, the disclosure is not limited thereto. The display apparatus according to an embodiment may be stretched or contracted even in a z direction in another embodiment, and the display apparatus may be changed into various shapes in a three-dimensional ("3D") space.

Figure 3A:
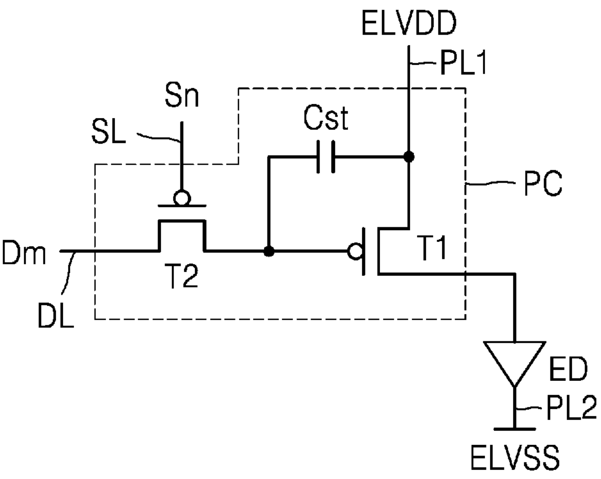
FIGS. 3A and 3B are equivalent circuit diagrams schematically illustrating any one light-emitting element of a display apparatus and a pixel circuit electrically connected to the light-emitting element, according to embodiments.
Figure 3B:
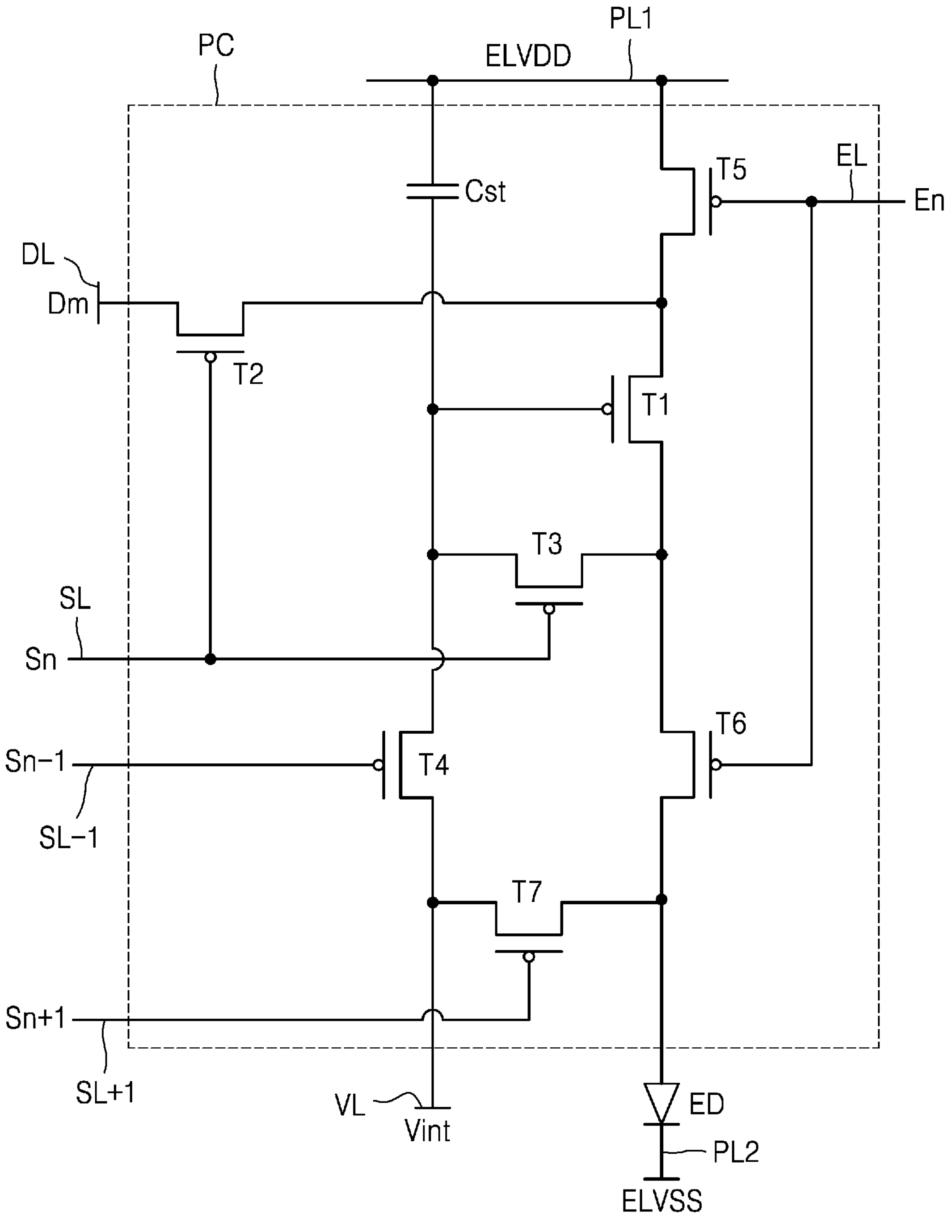

FIGS. 3A and 3B are equivalent circuit diagrams schematically illustrating a light-emitting element ED of the display apparatus 1 and a pixel circuit PC electrically connected to the light-emitting element ED, according to embodiments.

Referring to FIG. 3A, the pixel circuit PC may be connected to the light-emitting element ED so that sub-pixels emit light. The pixel circuit PC includes a driving thin-film transistor T1, a switching thin-film transistor T2, and a storage capacitor Cst. The switching thin-film transistor T2 is connected to a scan line SL and a data line DL, and transmits a data signal Dm input through the data line DL to the driving thin-film transistor T1 according to a scan signal Sn input through the scan line SL.

The storage capacitor Cst is connected to the switching thin-film transistor T2 and a first power voltage line PL1, and stores a voltage corresponding to a difference between a voltage received from the switching thin-film transistor T2 and a driving voltage ELVDD supplied to the first power voltage line PL1. The first power voltage line PL1 may be a driving voltage line.

The driving thin-film transistor T1 may be connected to the first power voltage line PL1 and the storage capacitor Cst, and may control driving current flowing from the first power voltage line PL1 to the light-emitting element ED in response to a value of the voltage stored in the storage capacitor Cst.

A second electrode (e.g., a cathode) of the light-emitting element ED receives a common voltage ELVSS through a second power voltage line PL2. The light-emitting element ED receives driving current from the driving thin-film transistor T1 to emit light. The second power voltage line PL2 may be a common voltage line.

Although the pixel circuit PC includes two thin-film transistors and one storage capacitor in FIG. 3A, the disclosure is not limited thereto.

Referring to FIG. 3B, a pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although each pixel circuit PC includes signals lines (e.g., SL, SL−1, SL+1, EL, and DL), an initialization voltage line VL, and a first power voltage line PL1 in FIG. 3B, the disclosure is not limited thereto. In another example, at least one of the signal lines (e.g., SL, SL−1, SL+1, EL, and DL), and/or the initialization voltage line VL may be shared by neighboring pixel circuits.

A drain electrode of the driving thin-film transistor T1 may be electrically connected to the light-emitting element ED via the emission control thin-film transistor T6. The driving thin-film transistor T1 receives a data signal Dm and supplies driving current to the light-emitting element ED according to a switching operation of the switching thin-film transistor T2.

A gate electrode of the switching thin-film transistor T2 is connected to a scan line SL, and a source electrode of the switching thin-film transistor T2 is connected to a data line DL. A drain electrode of the switching thin-film transistor T2 may be connected to a source electrode of the driving thin-film transistor T1, and may be connected to the first power voltage line PL1 via the operation control thin-film transistor T5.

The switching thin-film transistor T2 may be turned on according to a scan signal Sn received through the scan line SL, and may perform a switching operation of transmitting the data signal Dm through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1, and may be connected to a first electrode of the light-emitting element ED via the emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 is turned on according to the scan signal Sn received through the scan line SL, and diode-connects the driving thin-film transistor T1 by connecting the gate electrode and the drain electrode of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1, and may perform an initialization operation of initializing a voltage of the gate electrode of the driving thin-film transistor T1 by supplying an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the first power voltage line PL1. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the first electrode of the light-emitting element ED. The operation control thin-film transistor T5 and the emission control thin-film transistor T6 are simultaneously turned on according to an emission control signal En received through the emission control line EL so that a driving voltage ELVDD is applied to the light-emitting element ED and driving current flows through the light-emitting element ED.

A gate electrode of the second initialization thin-film transistor T7 may be connected to a next scan line SL+1. A source electrode of the second initialization thin-film transistor T7 may be connected to the first electrode of the light-emitting element ED. A drain electrode of the second initialization thin-film transistor T7 may be connected to the initialization voltage line VL. The second initialization thin-film transistor T7 may be turned on according to a next scan signal Sn+1 received through the next scan line SL+1 to initialize the first electrode of the light-emitting element ED.

Although the first initialization thin-film transistor T4 and the second initialization thin-film transistor T7 are connected to the previous scan line SL−1 and the next scan line SL+1, respectively, in FIG. 3B, the disclosure is not limited thereto. In another embodiment, both the first initialization thin-film transistor T4 and the second initialization thin-film transistor T7 may be connected to the previous scan line SL−1 and may be driven according to the previous scan signal Sn−1.

The other electrode of the storage capacitor Cst may be connected to the first power voltage line PL1. Any one electrode of the storage capacitor Cst may be connected to the gate electrode of the driving thin-film transistor T1, the drain electrode of the compensation thin-film transistor T3, and the source electrode of the first initialization thin-film transistor T4.

A second electrode (e.g., a cathode) of the light-emitting element ED receives a common voltage ELVSS through a second power voltage line PL2. The light-emitting element ED receives driving current from the driving thin-film transistor T1 to emit light.

The pixel circuit PC is not limited to the number of thin-film transistors and storage capacitors and a circuit design described with reference to FIGS. 3A and 3B and the number and the circuit design may be modified in various ways.

Figure 4:
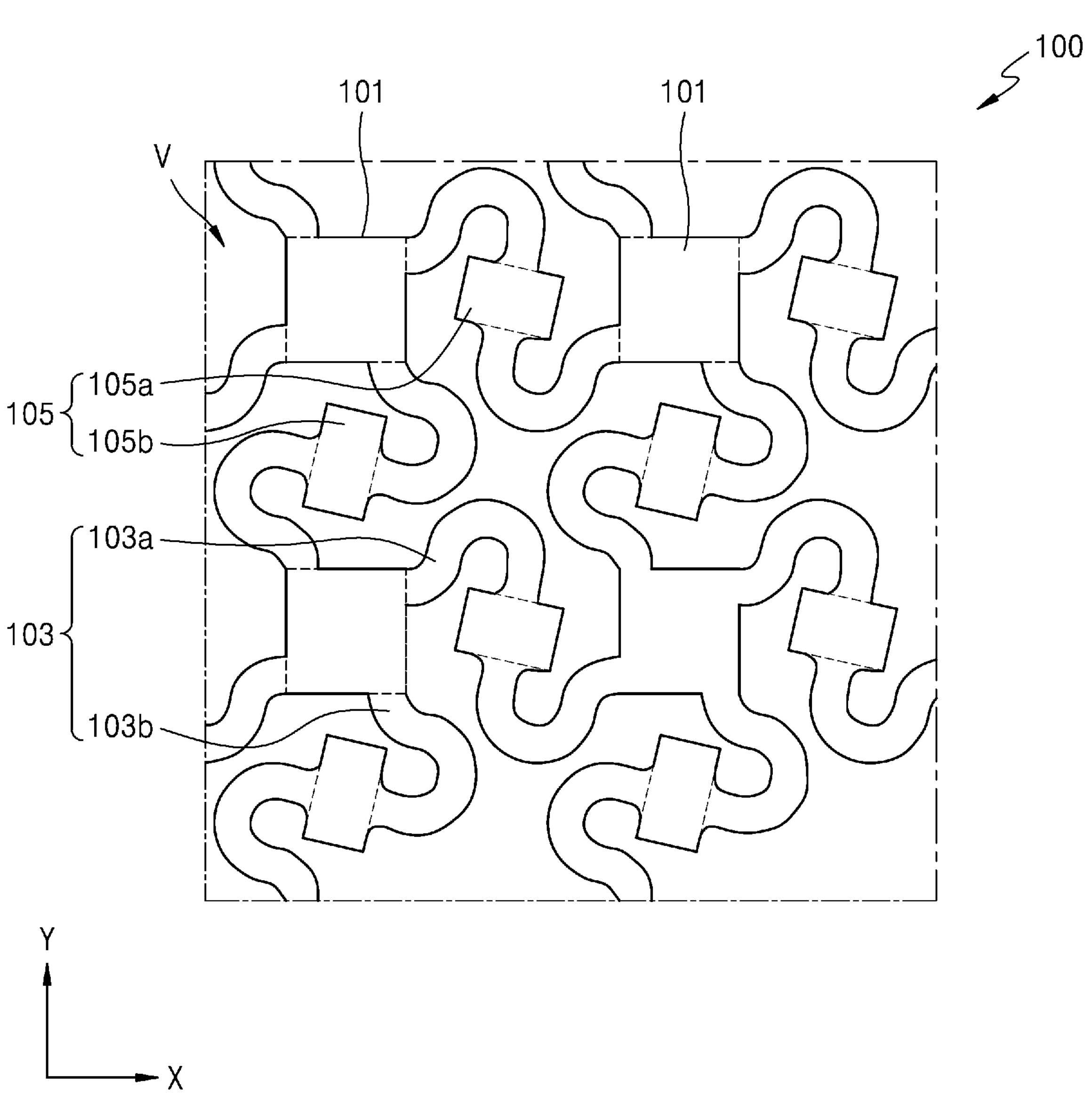
FIG. 4 is an enlarged plan view illustrating a part of a display area of a display apparatus, according to an embodiment.
Figure 5A:
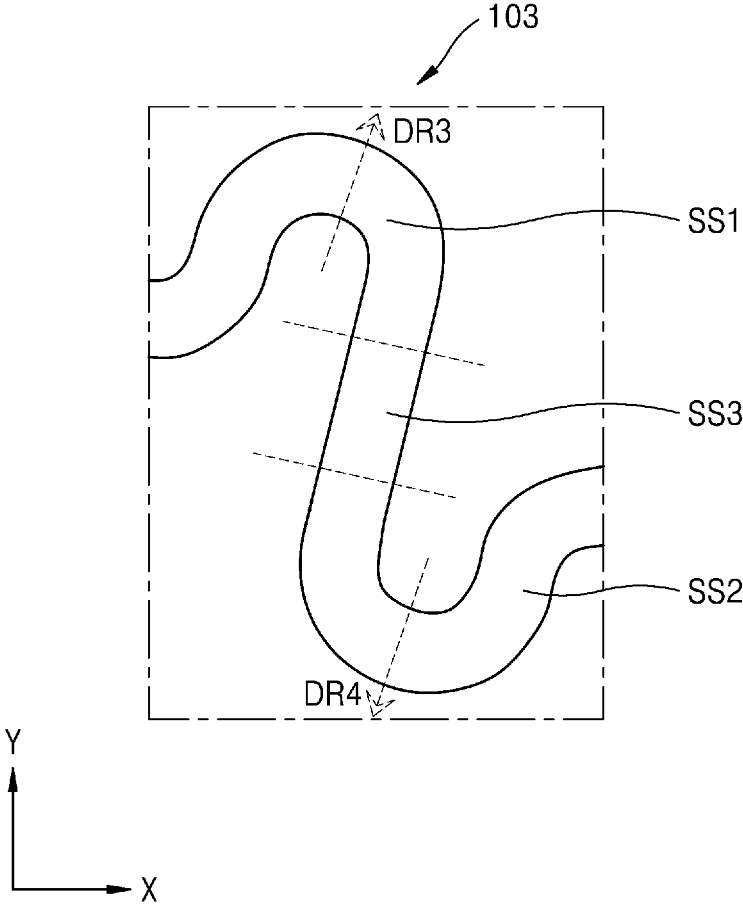
FIG. 5A is a view schematically illustrating a shape of a connecting unit of a substrate applicable to a display apparatus, according to an embodiment.
Figure 5B:
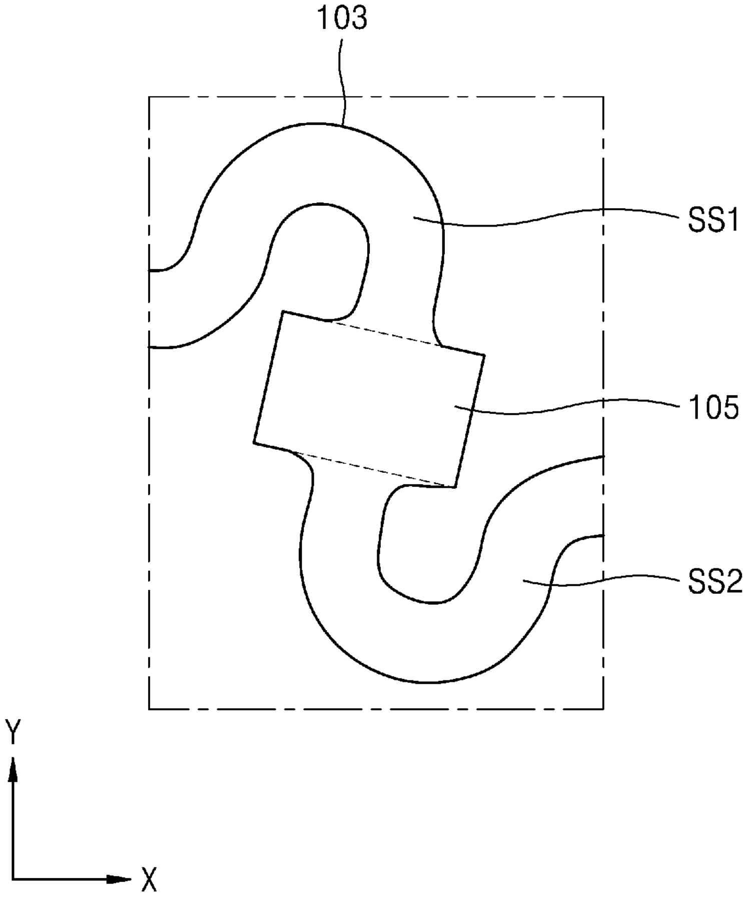
FIG. 5B is a view schematically illustrating shapes of a connecting unit and a sub-island of a substrate applicable to a display apparatus, according to an embodiment.

FIG. 4 is a schematic plan view illustrating a shape of a substrate applicable to a display apparatus, according to an embodiment. FIG. 5A is a view schematically illustrating a shape of a connecting unit of a substrate applicable to a display apparatus, according to an embodiment. FIG. 5B is a view schematically illustrating shapes of a connecting unit and a sub-island of a substrate applicable to a display apparatus, according to an embodiment. As used herein, the "plan view" is a view of a thickness direction (i.e., z direction) of the substrate of the display apparatus.

The substrate 100 may include any of various materials. In detail, the substrate 100 may be formed of glass, a metal, an organic material, or the like. In another embodiment, the substrate 100 may be formed of a flexible material. In an embodiment, for example, the substrate 100 may be formed of a material that may be curved, bent, folded, or rolled. The flexible material for forming the substrate 100 may include ultra-thin glass, metal, or plastic. When the substrate 100 includes plastic, the substrate 100 may include polyimide ("PI"). In another example, the substrate 100 may include any of other types of plastic materials.

Referring to FIGS. 4 to 5B, the substrate 100 of the display apparatus according to the present embodiment may include main islands 101, connecting units 103, sub-islands 105, and a through-portion V. The main islands 101, the connecting units 103, and the sub-islands 105 may be integrally formed (i.e., monolithic) with each other.

The main islands 101 may be spaced apart from each other by a certain interval in the first direction (the x direction) and the second direction (the y direction), and may have flat top surfaces.

The main islands 101 may be connected to each other by the connecting unit 103. The connecting unit 103 may include a first connecting unit 103*a* that connects the main islands 101 arranged in the first direction and a second connecting unit 103*b* that connects the main islands 101 arranged in the second direction.

Referring to FIG. 5A, the connecting unit 103 may include a first portion SS1 convexly curved in a third direction DR3 parallel to an xy plane and a second portion SS2 connected to the first portion SS1 and convexly curved in a fourth direction DR4 opposite to the third direction DR3 parallel to the same plane. The first portion SS1 and the second portion SS2 may be bent portions in a plan view. The third direction DR3 and the fourth direction DR4 may be directions intersecting the x direction and the y direction. However, the disclosure is not limited thereto. The third direction DR3 and the fourth direction DR4 may be directions parallel to the x direction or the y direction in another embodiment.

Although the connecting unit 103 includes one first portion SS1 and one second portion SS2 in FIG. 5A, the disclosure is not limited thereto, and the number of at least one of the first portion SS1 and the second portion SS2 of the connecting unit 103 may be two or more in another embodiment. In this case, the first portion SS1 and the second portion SS2 may be alternately arranged.

A third portion SS3 that connects the first portion SS1 to the second portion SS2 of the connecting unit 103 may be located between the first portion SS1 and the second portion SS2 of the connecting unit 103, and the third portion SS3 may correspond to an inflection point of the connecting unit 103. The third portion SS3 may be a straight portion that is not bent in a plan view. The third portion SS3 may have a smaller strain than the first portion SS1 and the second portion SS2. The first portion SS1, the second portion SS2, and the third portion SS3 may be continuously provided.

The connecting unit 103 may include at least two curved portions when viewed as a whole. The connecting unit 103 may have an S-shape or a wave shape when viewed as a whole.

Shapes of a plurality of connecting units 103 may be changed by an external force and lengths of the plurality of connecting units 103 may be increased or reduced, and when the external force is removed, the plurality of connecting units 103 may return to their original shapes. In detail, a length of the connecting unit 103 may be increased when the first portion SS1 and the second portion SS2 are unfolded, or a length of the connecting unit 103 may be reduced when the first portion SS1 and the second portion SS2 are contracted. Accordingly, an interval between a plurality of main islands 101 may be changed by a plurality of connecting units 103, and thus, a shape of the substrate 100 may be two-dimensionally or three-dimensionally changed.

Also, because the through-portion V that is an empty space is defined between the plurality of connecting units 103, the substrate 100 may have a mesh pattern, and thus, the substrate 100 may be highly flexible.

Referring to FIG. 5B, the sub-island 105 may be located in the third portion SS3 that is a middle portion of the connecting unit 103. Because the third portion SS3 has a smaller strain than the first portion SS1 and the second portion SS2, even when the sub-island 105 is located in the third portion SS3, deformation of the sub-island 105 may be minimized and a change in an elongation rate of the connecting unit 103 may be minimized.

The first portion SS1 of the connecting unit 103 may connect the main island 101 located on a left side of the sub-island 105 to the sub-island 105, and the second portion SS2 of the connecting unit 103 may connect the main island 101 located on a right side of the sub-island 105 to the sub-island 105.

Referring back to FIG. 4, the sub-islands 105 may include first sub-islands 105*a* located between the main islands 101 arranged in the first direction and second sub-islands 105*b* located between the main islands 101 arranged in the second direction. The first sub-island 105*a* may be located in a middle portion of the first connecting unit 103*a*, and the second sub-island 105*b* may be located in a middle portion of the second connecting unit 103*b*.

The area of the sub-island 105 may be less than the area of the main island 101 in a plan view. The main island 101 may be connected to four connecting units 103. The sub-island 105 may be connected to two connecting units 103. Although each of the main island 101 and the sub-island 105 is provided in a quadrangular shape, the disclosure is not limited thereto. Each of the main island 101 and the sub-island 105 may be provided in any of various shapes such as a circular shape, an elliptical shape, or a polygonal shape.

The through-portion V may be defined between the main islands 101, the sub-islands 105, and the connecting units 103. The through-portion V may be surrounded by the main islands 101, the sub-islands 105, and the connecting units 103.

The through-portions V are defined to pass through a top surface and a bottom surface of the substrate 100. The through-portion V may provide a separation area between the plurality of main islands 101, may reduce the weight of the substrate 100, and may improve the flexibility of the substrate 100. Also, because shapes of the through-portions V are changed when the substrate 100 is curved, bent, or rolled, generation of stress during deformation of the substrate 100 may be easily reduced, thereby preventing abnormal deformation of the substrate 100 and improving durability. Accordingly, when the display apparatus 10 is used, user convenience may be improved, and in particular, the display apparatus 10 may be easily applied to a wearable device.

The through-portion V may be formed by removing a portion of the substrate 100 by using etching or the like, there may be various examples of a process of forming the through-portion V in the substrate 100, and a manufacturing method thereof is not limited.

Figure 6:
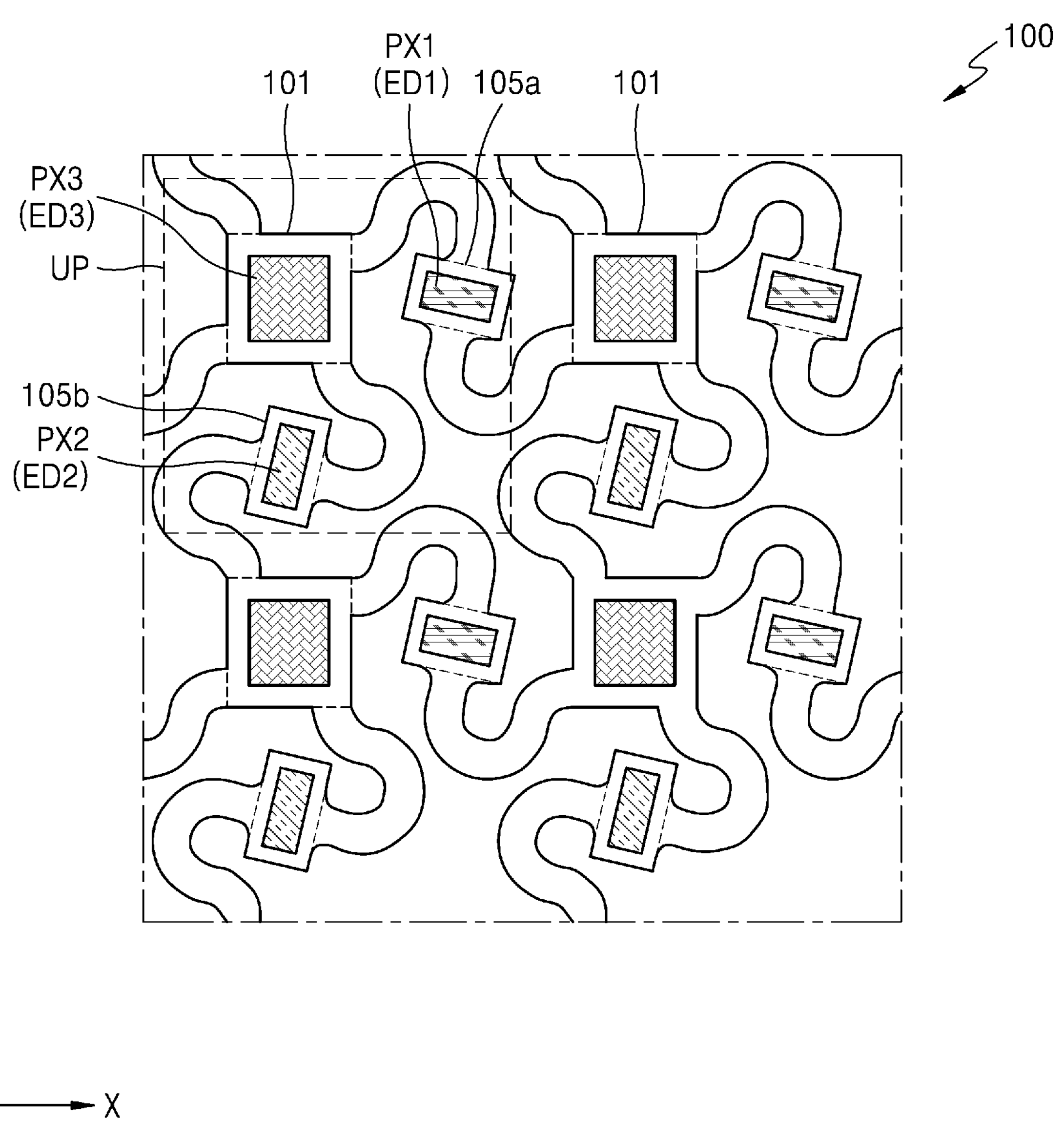
FIG. 6 is a plan view schematically illustrating a pixel arrangement or light-emitting diode arrangement structure of a display apparatus, according to an embodiment.

FIG. 6 is a plan view schematically illustrating a pixel arrangement or light-emitting diode arrangement structure of a display apparatus, according to an embodiment.

Referring to FIG. 6, in the display apparatus, a plurality of unit pixels UP may be repeatedly arranged in the x direction and the y direction. The unit pixel UP may include a first sub-pixel PX1, a second sub-pixel PX2, and a third sub-pixel PX3 for emitting light of different colors from each other. The first sub-pixel PX1, the second sub-pixel PX2, and the third sub-pixel PX3 may be red, green, and blue pixels, respectively.

The first sub-pixel PX1 may be located on the first sub-island 105*a*. The first sub-pixel PX1 may be implemented by a first light-emitting element ED1. The first light-emitting element ED1 may be located on the first sub-island 105*a*.

The second sub-pixel PX2 may be located on the second sub-island 105*b*. The second sub-pixel PX2 may be implemented by a second light-emitting element ED2. The second light-emitting element ED2 may be located on the second sub-island 105*b*.

The third sub-pixel PX3 may be located on the main island 101. The third sub-pixel PX3 may be implemented by a third light-emitting element ED3. The third light-emitting element ED3 may be located on the main island 101.

The first sub-pixel PX1 and the third sub-pixel PX3 may be alternately arranged in the x direction. The second sub-pixel PX2 and the third sub-pixel PX3 may be alternately arranged in the y direction. The third sub-pixel PX3 may be larger than the first sub-pixel PX1 and the second sub-pixel PX2.

The first sub-pixel PX1 may be spaced apart from the third sub-pixel PX3 in the x direction. The second sub-pixel PX2 may be spaced apart from the third sub-pixel PX3 in the y direction. In some embodiments, an interval between the center of the first sub-pixel PX1 and the center of the third sub-pixel PX3 may be equal to an interval between the center of the second sub-pixel PX2 and the center of the third sub-pixel PX3. The first sub-pixel PX1, the second sub-pixel PX2, and the third sub-pixel PX3 may be grouped to form one unit pixel UP.

In the present embodiment, because the first sub-pixel PX1 and the second sub-pixel PX2 are not located on the main island 101 but are located on the first sub-island 105*a* and the second sub-island 105*b* spaced apart from the main island 101, relative distances of the first sub-pixel PX1, the second sub-pixel PX2, and the third sub-pixel PX3 may be increased or reduced when the display apparatus is stretched or contracted. Accordingly, the size of a unit pixel may be increased or reduced as a whole, thereby effectively improving the visibility of the display apparatus.

Assuming that all of the first sub-pixel PX1, the second sub-pixel PX2, and the third sub-pixel PX3 are located on the main island 101, when the display apparatus is stretched or contracted, relative positions of the first sub-pixel PX1, the second sub-pixel PX2, and the third sub-pixel PX3 are maintained and only a non-display area around the first to third sub-pixels PX1, PX2, and PX3 is increased, thereby reducing visibility.

In embodiments, however, because at least some of the first sub-pixel PX1, the second sub-pixel PX2, and the third sub-pixel PX3 are located on the sub-islands 105, a decrease in visibility may be minimized even when the display apparatus is deformed.

Also, according to embodiments, because the first sub-pixel PX1, the second sub-pixel PX2, and the third sub-pixel PX3 are distributed, aperture ratios of the first sub-pixel PX1, the second sub-pixel PX2, and the third sub-pixel PX3 may be effectively improved.

Also, because the sub-island 105 is located on a portion of the connecting unit 103 where strain is minimized, even when the first sub-pixel PX1 and the second sub-pixel PX2 are located on the sub-islands 105, an elongation rate of the display apparatus may not be significantly affected.

Figure 7:
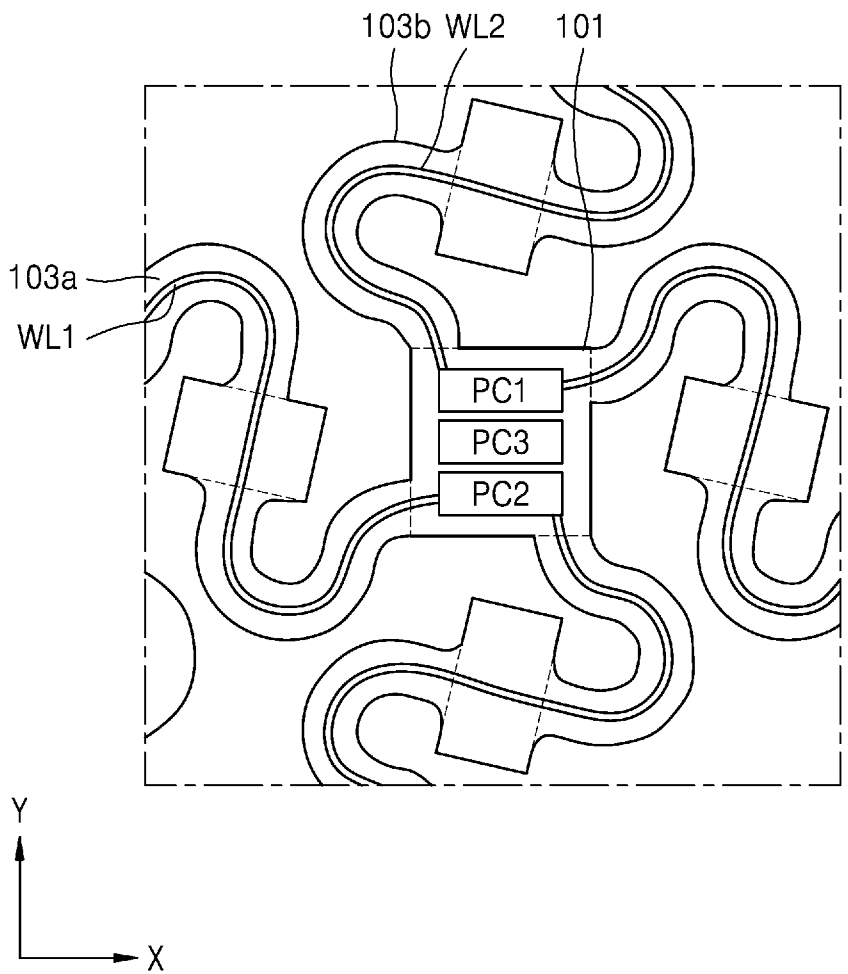
FIG. 7 is a plan view schematically illustrating an arrangement of pixel circuits and an arrangement of wirings of a display apparatus, according to an embodiment.
Figure 8:
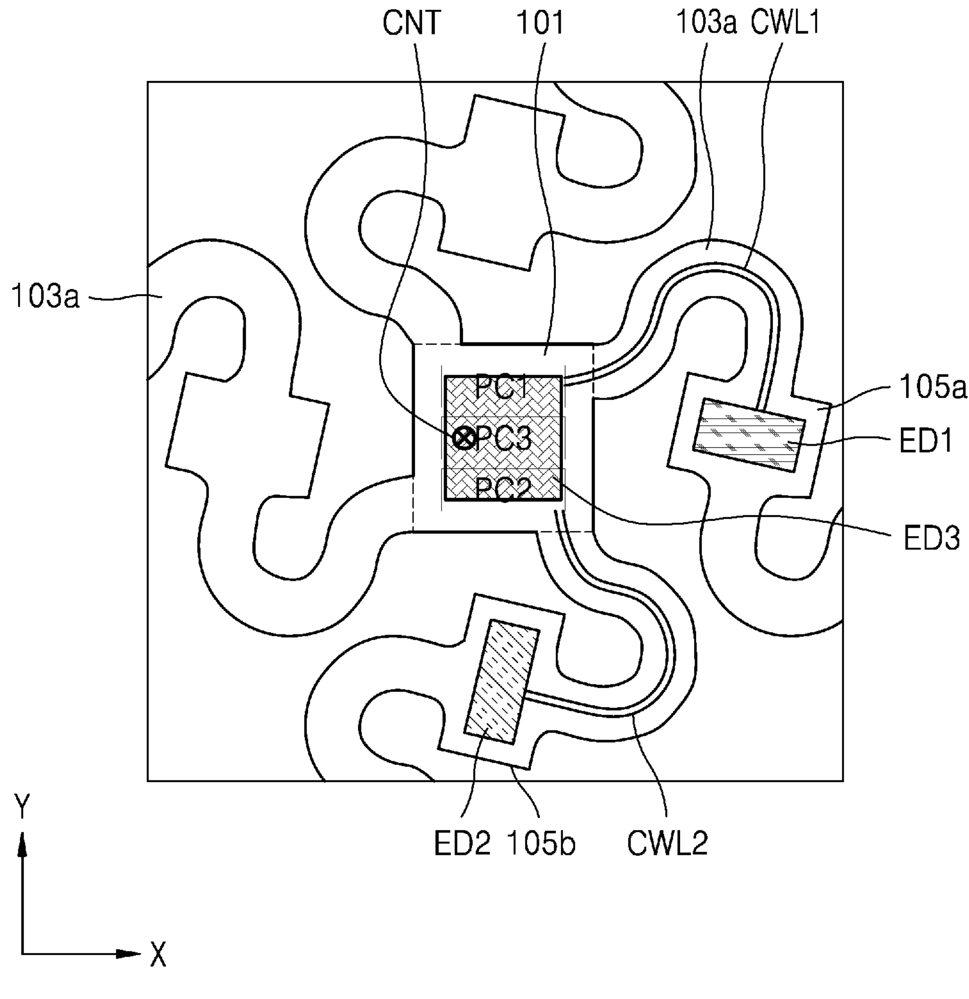
FIG. 8 is a plan view illustrating a connection relationship between a pixel circuit and a light-emitting element of a display apparatus, according to an embodiment.

FIG. 7 is a plan view schematically illustrating an arrangement of pixel circuits and an arrangement of wirings of a display apparatus, according to an embodiment. FIG. 8 is a plan view illustrating a connection relationship between a pixel circuit and a light-emitting element of a display apparatus, according to an embodiment. In FIGS. 7 and 8, only some elements are illustrated for convenience of explanation.

Referring to FIGS. 7 and 8, a first pixel circuit PC1, a second pixel circuit PC2, and a third pixel circuit PC3 are located on the main island 101.

A first wiring WL1 may be located on the first connecting unit 103*a*, and the first wiring WL1 may be electrically connected to the first pixel circuit PC1, the second pixel circuit PC2, and the third pixel circuit PC3. The first wiring WL1 that is a signal line such as a scan line or an emission control line may provide a scan signal or an emission control signal to the first pixel circuit PC1, the second pixel circuit PC2, and the third pixel circuit PC3.

The first wiring WL1 may extend in the first direction and may be curved along a shape of the first connecting unit 103*a*. The first wiring WL1 may include at least two curved portions on the first connecting unit 103*a*. The first wiring WL1 may be continuously located on the first connecting unit 103*a*. The first wiring WL1 may be continuously located on the first sub-island 105*a*.

A second wiring WL2 may be located on the second connecting unit 103*b*, and the second wiring WL2 may be electrically connected to the first pixel circuit PC1, the second pixel circuit PC2, and the third pixel circuit PC3. The second wiring WL2 that is a data line may provide a data signal to the first pixel circuit PC1, the second pixel circuit PC2, and the third pixel circuit PC3.

The second wiring WL2 may extend in the second direction and may be curved along a shape of the second connecting unit 103*b*. The second wiring WL2 may include at least two curved portions on the second connecting unit 103*b*. The second wiring WL2 may be continuously located on the second connecting unit 103*b*. The second wiring WL2 may be continuously located on the second sub-island 105*b*.

The first pixel circuit PC1 may be a pixel circuit for driving the first light-emitting element ED1. Because the first light-emitting element ED1 is located on the first sub-island 105*a*, the first pixel circuit PC1 may be connected to the first light-emitting element ED1 by a first connection wiring CWL1. The first connection wiring CWL1 may be located on the first connecting unit 103*a*.

The second pixel circuit PC2 may be a pixel circuit for driving the second light-emitting element ED2. Because the second light-emitting element ED2 is located on the second sub-island 105*b*, the second pixel circuit PC2 may be connected to the second light-emitting element ED2 by a second connection wiring CWL2. The second connection wiring CWL2 may be located on the second connecting unit 103*b*.

The third pixel circuit PC3 may be a pixel circuit for driving the third light-emitting element ED3. Because the third light-emitting element ED3 is located on the main island 101, the third pixel circuit PC3 may be connected to the third light-emitting element ED3 by a contact hole CNT or a connection electrode.

Figure 9:
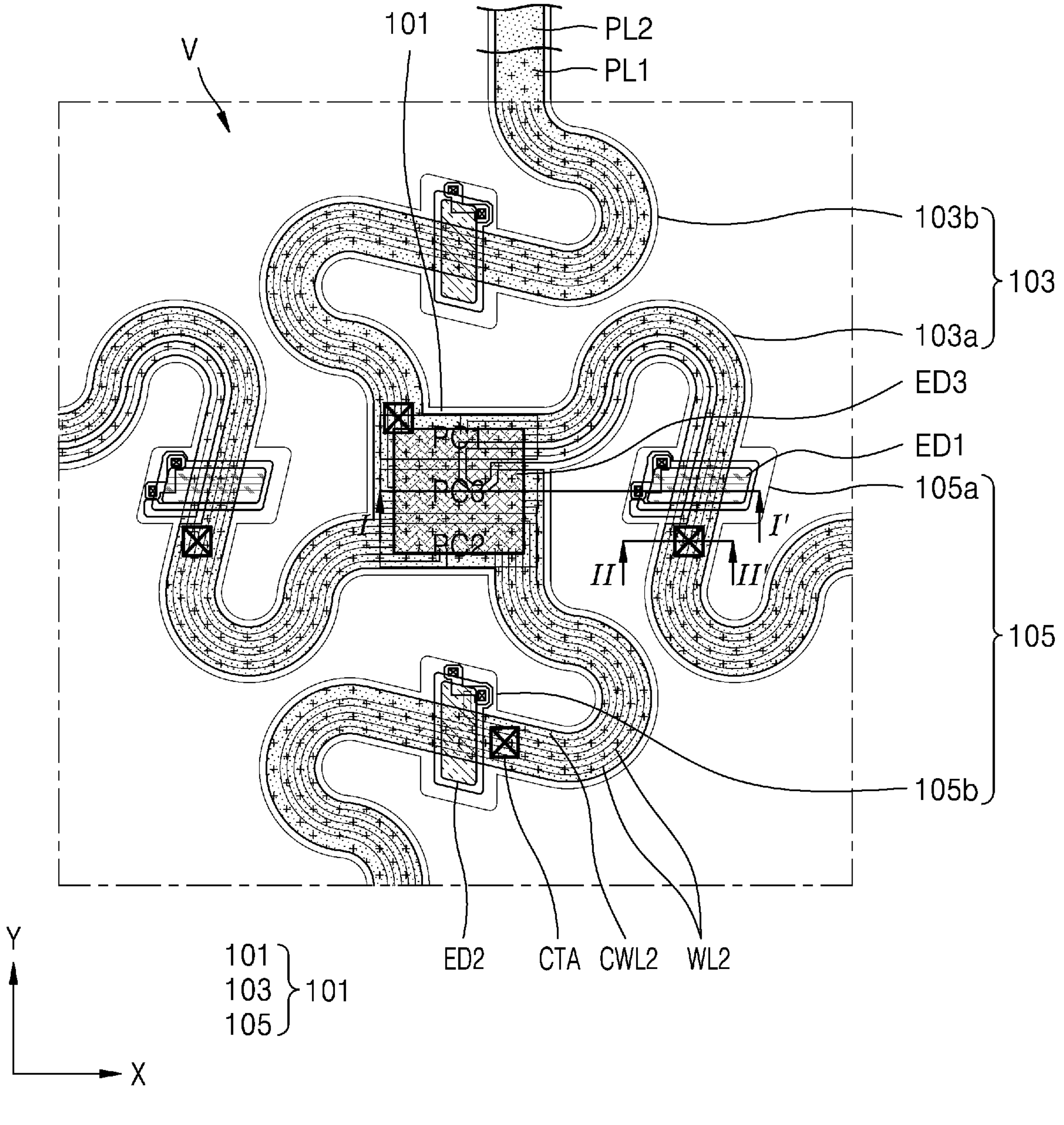
FIG. 9 is a plan layout view illustrating a part of a display apparatus, according to an embodiment.
Figure 10:
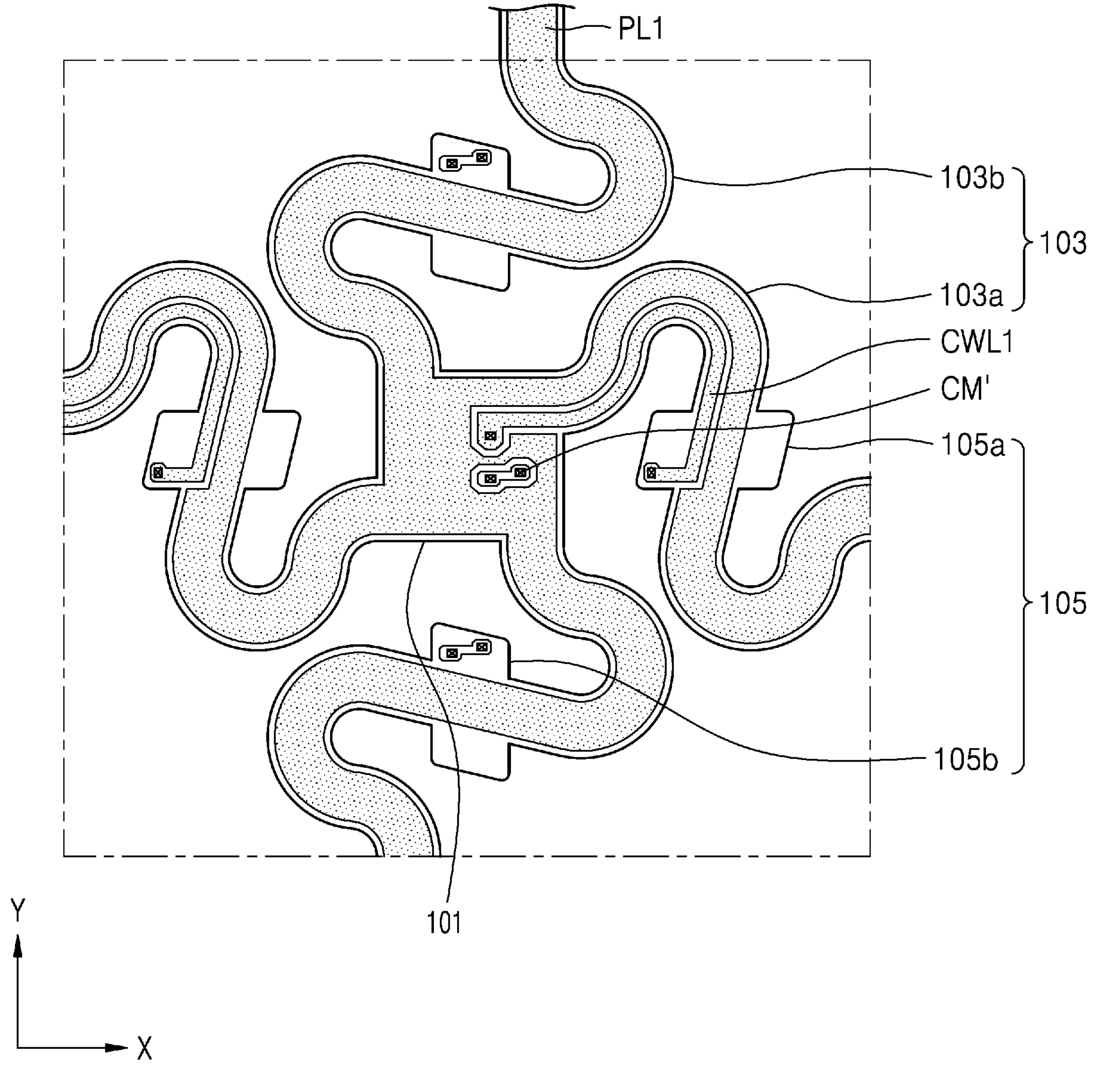
FIG. 10 is a plan layout view schematically illustrating a layer on which a first power voltage line and a first connection wiring are located from among elements of FIG. 9.
Figure 11:
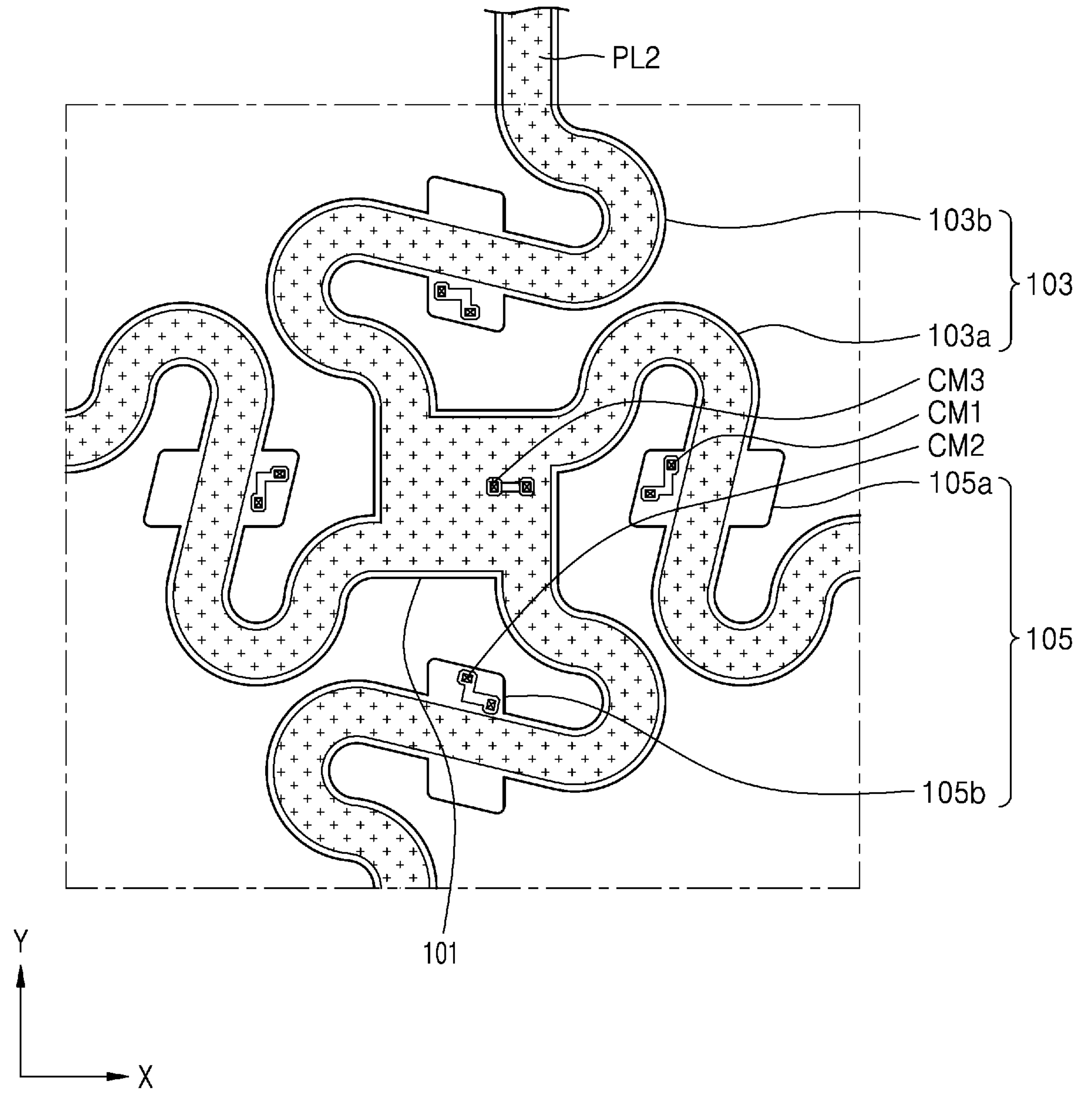
FIG. 11 is a plan layout view schematically illustrating a layer on which a second power voltage line is located from among elements of FIG. 9.

FIG. 9 is a plan layout view illustrating a part of a display apparatus, according to an embodiment. FIG. 10 is a plan layout view schematically illustrating a layer on which a first power voltage line and a first connection wiring are located from among elements of FIG. 9. FIG. 11 is a plan layout view schematically illustrating a layer on which a second power voltage line is located from among elements of FIG. 9.

Referring to FIG. 9, the display apparatus according to an embodiment includes the substrate 100 including the main island 101, the first sub-island 105*a*, the second sub-island 105*b*, the first connecting unit 103*a*, the second connecting unit 103*b*, and the through-portion V.

The first pixel circuit PC1, the second pixel circuit PC2, and the third pixel circuit PC3 may be located on the main island 101, and the first light-emitting element ED1 connected to the first pixel circuit PC1 may be located on the first sub-island 105*a*. The second light-emitting element ED2 connected to the second pixel circuit PC2 may be located on the second sub-island 105*b*. The third light-emitting element ED3 connected to the third pixel circuit PC3 may be located on the main island 101.

Contact areas CTA may be located around the first light-emitting element ED1, the second light-emitting element ED2, and the third light-emitting element ED3. The contact area CTA may be an area where a second electrode of a corresponding light-emitting element and the second power voltage line PL2 are connected. Because each of the contact areas CTA is located for each light-emitting element, a common voltage applied to the light-emitting elements may be uniform.

In an embodiment, an emission area of the third light-emitting element ED3 may be greater than an emission area of the first light-emitting element ED1 and an emission area of the second light-emitting element ED2. Alternatively, a size of a third sub-pixel implemented by the third light-emitting element ED3 may be greater than each of a size of a first sub-pixel implemented by the first light-emitting element ED1 and a size of a second sub-pixel implemented by the second light-emitting element ED2 in a plan view.

In an embodiment, the third light-emitting element ED3 may overlap the first pixel circuit PC1, the second pixel circuit PC2, and the third pixel circuit PC3 in a plan view. In an embodiment, the first light-emitting element ED1 may overlap the first wirings WL1. In an embodiment, the second light-emitting element ED2 may overlap the second wirings WL2 in a plan view.

The first wirings WL1 may be located on the first connecting unit 103*a*, and the second wirings WL2 may be located on the second connecting unit 103*b*.

A plurality of first wirings WL1 may be provided, and each of the first wirings WL1 may be a wiring that transmits a signal to the first pixel circuit PC1, the second pixel circuit PC2, and the third pixel circuit PC3. The first wirings WL1 may transmit a scan signal or an emission control signal to the first pixel circuit PC1, the second pixel circuit PC2, and the third pixel circuit PC3.

A plurality of second wirings WL2 may be provided, and each of the second wirings WL2 may be a wiring that transmits a signal to the first pixel circuit PC1, the second pixel circuit PC2, and the third pixel circuit PC3. The second wirings WL2 may transmit a data signal to the first pixel circuit PC1, the second pixel circuit PC2, and the third pixel circuit PC3. The second connection wiring CWL2 may be located on a side of the second wirings WL2. The second connection wiring CWL2 may connect one electrode of the second light-emitting element ED2 to the second pixel circuit PC2. The second connection wiring CWL2 may be located in the same layer as the second wiring WL2. The first wiring WL1 and the second wiring WL2 may be located in the same layer.

Referring to FIGS. 10 and 11, the first power voltage line PL1 and the second power voltage line PL2 may be located on most portions of the substrate 100.

The first power voltage line PL1 may be located on the main island 101, the first sub-island 105*a*, the second sub-island 105*b*, the first connecting unit 103*a*, and the second connecting unit 103*b*. The first power voltage line PL1 may be located to correspond to shapes of the main island 101 and the connecting unit 103 of the substrate 100.

The first connection wiring CWL1 may be located in the same layer as the first power voltage line PL1. The first connection wiring CWL1 may extend along a side of the first power voltage line PL1. One end of the first connection wiring CWL1 may be connected to the first pixel circuit PC1, and the other end may be connected to one electrode of the first light-emitting element ED1 through a first connection electrode CM1.

A connection electrode CM' may be located in the same layer as the first power voltage line PL1. The connection electrode CM' may be located on the main island 101 and may be surrounded by the first power voltage line PL1. The connection electrode CM' may be connected to the third pixel circuit PC3 and one electrode of the third light-emitting element ED.

The second power voltage line PL2 may be located on the main island 101, the first sub-island 105*a*, the second sub-island 105*b*, the first connecting unit 103*a*, and the second connecting unit 103*b*. The second power voltage line PL2 may be located to correspond to shapes of the main island 101 and the connecting unit 103 of the substrate 100.

The first connection electrode CM1, a second connection electrode CM2, and a third connection electrode CM3 may be located in the same layer as the second power voltage line PL2. The first connection electrode CM1 may be located on the first sub-island 105*a*. The first connection electrode CM1 may connect the first connection wiring CWL1 to one electrode of the first light-emitting element ED1. The second connection electrode CM2 may be located on the second sub-island 105*b*. The first connection electrode CM1 may connect the first connection wiring CWL1 to one electrode of the first light-emitting element ED1. The third connection electrode CM3 may be located on the main island 101 and may be surrounded by the second power voltage line PL2. The third connection electrode CM3 may connect the third pixel circuit PC3 to one electrode of the third light-emitting element.

Figure 12:
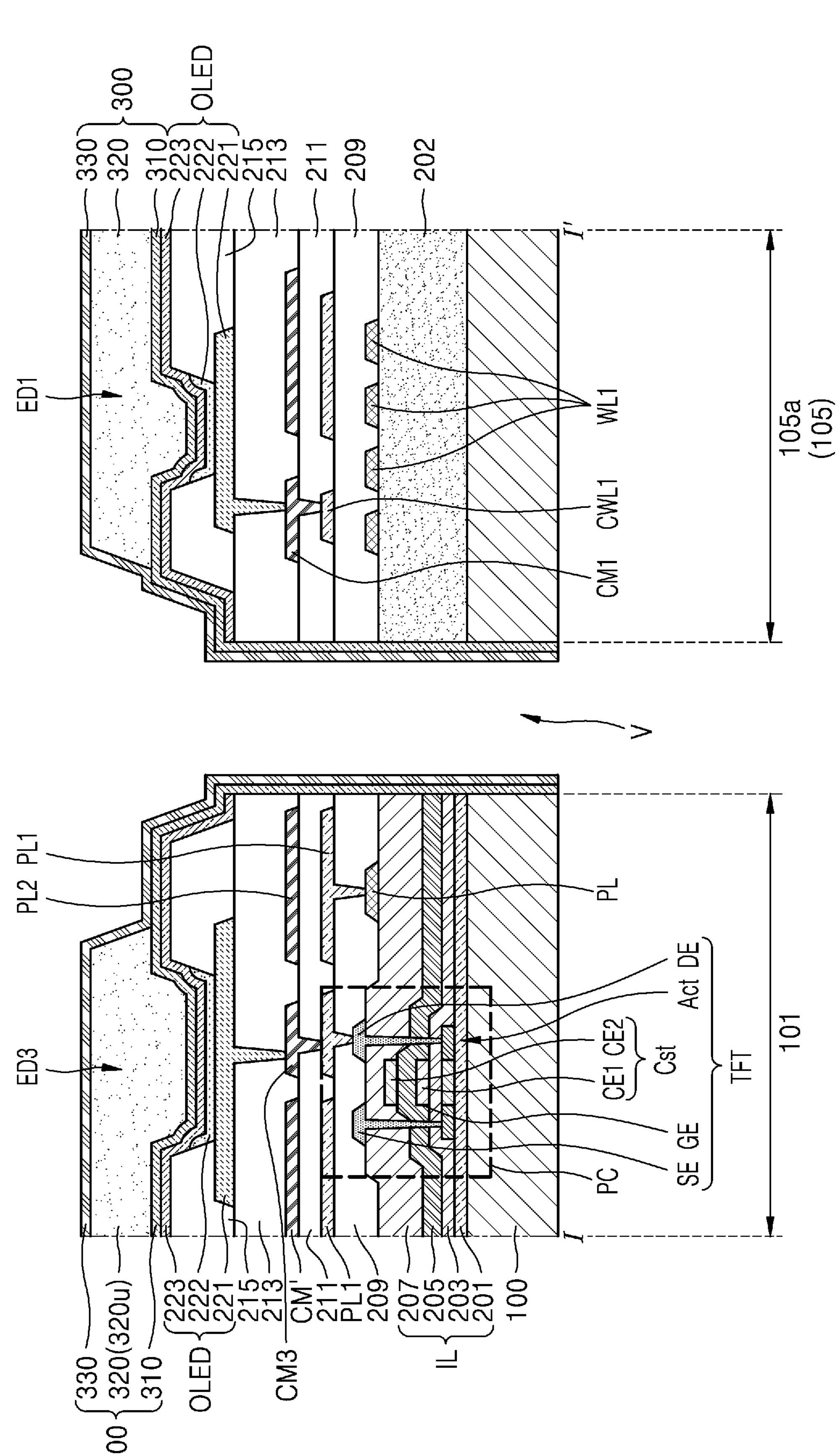
FIG. 12 is a schematic cross-sectional view taken along line I-I' of FIG. 9.
Figure 13:
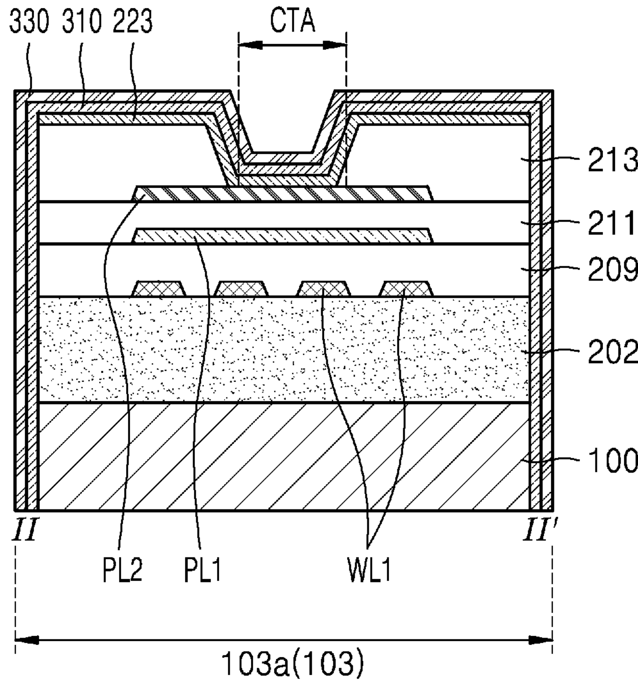
FIG. 13 is a schematic cross-sectional view taken along line II-II' of FIG. 9.

FIG. 12 is a schematic cross-sectional view taken along line I-I' of FIG. 9. FIG. 13 is a schematic cross-sectional view taken along line II-II' of FIG. 9.

Referring to FIGS. 12 and 13, the display apparatus according to an embodiment may include the substrate 100 including the main island 101, the sub-island 105, and the connecting unit 103. The pixel circuit PC, the third light-emitting element ED3, and an encapsulation layer 300 may be located on the main island 101. The first wirings WL1, the first light-emitting element ED1, and the encapsulation layer 300 may be located on the first sub-island 105*a*, and the first wirings WL1 and the contact area CTA may be located on the first connecting unit 103*a*. In an embodiment, the first and third light-emitting elements ED1 and ED3 may be organic light-emitting elements OELD.

First, the pixel circuit PC, the third light-emitting element ED3, and the encapsulation layer 300 located on the main island 101 will be described in a stacking order.

A buffer layer 201 may be formed on the main island 101 to prevent impurities from penetrating into a semiconductor layer Act of a thin-film transistor TFT. The buffer layer 201 may include an inorganic insulating material such as silicon oxide, silicon nitride, or silicon oxynitride, and may have a single or multi-layer structure including the above inorganic insulating material.

The pixel circuit PC may be located on the buffer layer 201. The pixel circuit PC includes the thin-film transistor TFT and a storage capacitor Cst. The thin-film transistor TFT may include the semiconductor layer Act, a gate electrode GE, a source electrode SE, and a drain electrode DE. Although the thin-film transistor TFT is a top-gate type transistor in which the gate electrode GE is located over the semiconductor layer Act with a gate insulating layer 203 therebetween in the present embodiment, in another embodiment, the thin-film transistor TFT may be a bottom-gate type transistor.

The semiconductor layer Act may include polysilicon. Alternatively, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, or hafnium oxide. The gate insulating layer 203 may have a single or multi-layer structure including the above material.

Each of the source electrode SE or the drain electrode DE may include a material having excellent conductivity. Each of the source electrode SE and the drain electrode DE may include a conductive material including molybdenum (Mo), aluminum (Al), copper (Cu), or titanium (Ti), and may have a single or multi-layer structure including the above material. In an embodiment, each of the source electrode SE and the drain electrode DE may have a multi-layer structure including Ti/Al/Ti.

The storage capacitor Cst may include a lower electrode CE1 and an upper electrode CE2 overlapping each other with a first interlayer-insulating layer 205 therebetween in a plan view. The storage capacitor Cst may overlap the thin-film transistor TFT. In this regard, in FIG. 12, the gate electrode GE of the thin-film transistor TFT is the lower electrode CE1 of the storage capacitor Cst. In another embodiment, the storage capacitor Cst may not overlap the thin-film transistor TFT in a plan view. The storage capacitor Cst may be covered by a second interlayer-insulating layer 207.

Each of the first and second interlayer-insulating layers 205 and 207 may include an inorganic insulating material such as silicon oxide, silicon nitride, silicon oxynitride, aluminum oxide, titanium oxide, tantalum oxide, or hafnium oxide. Each of the first and second interlayer-insulating layers 205 and 207 may have a single or multi-layer structure including the above material.

A lower first power voltage line PL may be located on the second interlayer-insulating layer 207. The lower first power voltage line PL may be connected to the pixel circuit PC to transmit a driving voltage to the pixel circuit PC. The lower first power voltage line PL may be connected to the first power voltage line PL1 located over the lower first power voltage line PL through a contact hole defined in the first organic insulating layer 209.

The pixel circuit PC including the thin-film transistor TFT and the storage capacitor Cst and the lower first power voltage line PL may be covered by a first organic insulating layer 209.

The first power voltage line PL1 and the connection electrode CM' may be located on the first organic insulating layer 209. The first power voltage line PL1 that is a wiring for transmitting the driving voltage ELVDD (see FIG. 3A) may be located to correspond to most of the main island 101. Accordingly, a voltage drop phenomenon of the driving voltage may be minimized. The connection electrode CM' may be located in the same layer as the first power voltage line PL1 to be spaced apart from the first power voltage line PL1. The connection electrode CM' may be connected to the third connection electrode CM3 located over the connection electrode CM' to connect the pixel circuit PC to a first electrode 221 of the third light-emitting element ED3.

Each of the first power voltage line PL1 and the connection electrode CM' may include a material having excellent conductivity. Each of the first power voltage line PL1 and the connection electrode CM' may include a conductive material including molybdenum (Mo), aluminum (Al), copper (Cu), or titanium (Ti), and may have a single or multi-layer structure including the above material.

The second power voltage line PL2 and the third connection electrode CM3 may be located on a second organic insulating layer 211. The second power voltage line PL2 that is a wiring for transmitting the common voltage ELVSS (see FIG. 3A) may be located to correspond to most of the main island 101. Accordingly, a voltage drop phenomenon of the common voltage may be minimized. The third connection electrode CM3 may be located in the same layer as the second power voltage line PL2 to be spaced apart from the second power voltage line PL2. The third connection electrode CM3 may be connected to the connection electrode CM' through a contact hole passing through the first organic insulating layer 209. The third connection electrode CM3 may be connected to the first electrode 221 of the third light-emitting element ED3.

Each of the second power voltage line PL2 and the third connection electrode CM3 may include a material having excellent conductivity. Each of the second power voltage line PL2 and the third connection electrode CM3 may include a conductive material including molybdenum (Mo), aluminum (Al), copper (Cu), or titanium (Ti), and may have a single or multi-layer structure including the above material.

The second power voltage line PL2 and the third connection electrode CM may be covered by a third organic insulating layer 213. Each of the first organic insulating layer 209, the second organic insulating layer 211, and the third organic insulating layer 213 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, each of the first organic insulating layer 209, the second organic insulating layer 211, and the third organic insulating layer 213 may include polyimide. Various modifications may be made. For example, the first organic insulating layer 209, the second organic insulating layer 211, and the third organic insulating layer 213 may include the same material or different materials.

To form the first organic insulating layer 209, the second organic insulating layer 211, and the third organic insulating layer 213, a liquid organic material may be applied and then a mask process and a development process may be performed to form a contact hole. As such, because the first organic insulating layer 209, the second organic insulating layer 211, and the third organic insulating layer 213 are formed by curing a liquid organic material, top surfaces thereof may be substantially flat.

The third light-emitting element ED may be located on the third organic insulating layer 213 on the main island 101. The third light-emitting element ED3 may include the first electrode 221, an intermediate layer 222, and a second electrode 223.

The first electrode 221 may be located on the third organic insulating layer 213. The first electrode 221 may be a pixel electrode or an anode electrode. The first electrode 221 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 221 may further include a film formed of ITO, IZO, ZnO, or $In_2O_3$ over/under the reflective film.

A pixel-defining film 215 may be formed on the first electrode 221. The pixel-defining film 215 may define an opening through which a top surface of the first electrode 221 is exposed, and may cover an edge of the first electrode 221. Accordingly, the pixel-defining film 215 may define an emission area of a pixel. The pixel-defining film 215 may include an organic insulating material. Alternatively, the pixel-defining film 215 may include an inorganic insulating material such as silicon nitride (SiNx), silicon oxynitride (SiON), or silicon oxide (SiOx). Alternatively, the pixel-defining film 215 may include an organic insulating material and an inorganic insulating material.

The intermediate layer 222 may include a low molecular weight material or a high molecular weight material. When the intermediate layer 222 includes a low molecular weight material, the intermediate layer 222 may have a single or stacked structure in which a hole injection layer ("HIL"), a hole transport layer ("HTL"), an emission layer ("EML"), an electron transport layer ("ETL"), and an electron injection layer ("EIL") are stacked, and may include any of various organic materials such as copper phthalocyanine ("CuPc"), N,N'-Di(napthalene-1-yl)-N,N'-diphenyl-benzidine ("NPB"), or tris-8-hydroxyquinoline aluminum (Alq3). These layers may be formed by using vacuum deposition.

When the intermediate layer 222 includes a high molecular weight material, the intermediate layer 222 may have a structure including an HTL and an EML. In this case, the HTL may include poly(3,4-ethylenedioxythiophene) ("PEDOT"), and the EML may include a polymer material such as a polyphenylene vinylene ("PPV")-based material or a polyfluorene-based material. The intermediate layer 222 may be formed by using screen printing, inkjet printing, laser-induced thermal imaging ("LITI"), or the like.

The intermediate layer 222 is not necessarily limited thereto, and may have any of various structures. The intermediate layer 222 may include a layer that is integrally formed over a plurality of first electrodes 221, or may include a layer that is patterned to correspond to each of the plurality of first electrodes 221.

The second electrode 223 may be formed of a conductive material having a low work function. The second electrode 223 may be a counter electrode or a cathode electrode. In an embodiment, for example, the second electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 223 may further include a layer formed of ITO, IZO, ZnO, or $In_2O_3$ on the (semi-)transparent layer including the above material. The intermediate layer 222 and the second electrode 223 may be formed by using thermal deposition. A capping layer (not shown) for protecting the second electrode 223 and improving light extraction efficiency may be further located on the second electrode 223. The capping layer may include LiF, an inorganic material, and/or an organic material.

The third light-emitting element ED3 may be provided by stacking the first electrode 221, the intermediate layer 222, and the second electrode 223, and the third light-emitting element ED3 may overlap the third pixel circuit PC3 in a plan view.

The encapsulation layer 300 is formed on the second electrode 223. The encapsulation layer 300 may be a member for sealing the third light-emitting element ED3. The encapsulation layer 300 may block external oxygen and moisture, and may have a single or multi-layer structure. The encapsulation layer 300 may include at least one of an organic encapsulation layer and an inorganic encapsulation layer.

Although the encapsulation layer 300 includes first and second inorganic encapsulation layers 310 and 330, and an organic encapsulation layer 320 located between the first and second inorganic encapsulation layers 310 and 330 in FIG. 12, the disclosure is not limited thereto. In another embodiment, the number of organic encapsulation layers, the number of inorganic encapsulation layers, and a stacking order may be changed.

Each of the first and second inorganic encapsulation layers 310 and 330 may include at least one inorganic insulating material such as aluminum oxide, titanium oxide, tantalum oxide, hafnium oxide, zinc oxide, silicon oxide, silicon nitride, or silicon oxynitride, and may be formed by using chemical vapor deposition ("CVD") or the like.

Because the first inorganic encapsulation layer 310 is formed along a lower structure, a top surface of the first inorganic encapsulation layer 310 is not flat. The organic encapsulation layer 320 may cover the first inorganic encapsulation layer 310 to have a substantially flat top surface, unlike the first inorganic encapsulation layer 310. In detail, a portion of the organic encapsulation layer 320 corresponding to the third light-emitting element ED3 as a display element may have a substantially flat top surface. Also, the organic encapsulation layer 320 may reduce stress generated in the first and second inorganic encapsulation layers 310 and 330.

The organic encapsulation layer 320 may include polymethyl methacrylate (PMMA), polycarbonate ("PC"), polystyrene (PS), an acrylic resin, an epoxy resin, polyimide, polyethylene, polyethylene sulfonate, polyoxymethylene, polyarylate, or hexamethyldisiloxane ("HMDSO").

In the present embodiment, the organic encapsulation layer 320 may include unit organic encapsulation layers 320*u* to correspond to the main islands 101, respectively. That is, the unit organic encapsulation layer 320*u* may be located on the main island 101 of the substrate 100, and may not be located on the connecting unit 103. Accordingly, because the first inorganic encapsulation layer 310 and the second inorganic encapsulation layer 330 contact each other outside the unit organic encapsulation layer 320*u*, elements located on the main island 101 may be individually encapsulated.

As such, because the encapsulation layer 300 includes the first inorganic encapsulation layer 310, the organic encapsulation layer 320, and the second inorganic encapsulation layer 330, even when cracks occur in the encapsulation layer 300, due to the multi-layer structure, the cracks may not be connected between the first inorganic encapsulation layer 310 and the organic encapsulation layer 320 or between the organic encapsulation layer 320 and the second inorganic encapsulation layer 330. Accordingly, the formation of a path through which external moisture or oxygen penetrates into a unit display unit 200 may be prevented or minimized. Also, because the second inorganic encapsulation layer 330 contacts the first inorganic encapsulation layer 310 at an edge of the main island 101, the unit organic encapsulation layer 320*u* may be prevented from being exposed to the outside.

Because the first inorganic encapsulation layer 310 and the second inorganic encapsulation layer 330 may be formed on the entire surface of the substrate 100 by using chemical vapor deposition (CVD), the first inorganic encapsulation layer 310 and the second inorganic encapsulation layer 330 may be formed to cover a side surface of the through-portion V.

When the unit organic encapsulation layer 320*u* is formed, a certain amount of liquid organic material is applied and then cured. In this case, due to the characteristics of the liquid organic material, the liquid organic material may flow to an edge of the main island 101. To prevent this, a dam structure (not shown) and/or a concave recess structure (not shown) may be further provided at an edge of the main island 101.

The first wirings WL1 for applying various signals to the pixel circuit PC are provided on the first sub-island 105*a* and the first connecting unit 103*a*. Because the first sub-island 105*a* is located on a middle portion of the first connecting unit 103*a*, the first sub-island 105*a* may be a part of the first connecting unit 103*a*.

Also, the first power voltage line PL1 and the second power voltage line PL2 are located on the first sub-island 105*a* and the first connecting unit 103*a*. The first light-emitting element ED1 is located on the first sub-island 105*a*.

An organic material layer 202 may be located on the first sub-island 105*a* and the first connecting unit 103*a*. The first wirings WL1 may be located on the organic material layer 202. When the buffer layer 201, the gate insulating layer 203, the first interlayer-insulating layer 205, and the second interlayer-insulating layer 207 located on the main island 101 are referred to as an inorganic insulating layer IL, the inorganic insulating layer IL may be removed from the first sub-island 105*a* and the first connecting unit 103*a*, and the organic material layer 202 may be formed.

Because the organic material layer 202 has a lower hardness than an inorganic material, the organic material layer 202 may absorb tensile stress caused by deformation of the first connecting unit 103*a*, thereby minimizing stress concentration on the first wirings WL1. Also, because the organic material layer 202 is located under the first wirings WL1, a neutral plane may be located at positions of the first wirings WL1. Also, the organic material layer 202 may prevent a height difference from occurring when the first wiring WL1 extends to the main island 101.

The organic material layer 202 may be formed of an organic insulating material such as polyimide, polyamide, acrylic resin, benzocyclobutene, hexamethyldisiloxane (HMDSO), or phenolic resin. The organic material layer 202 may have a single or multi-layer structure including the organic insulating material.

The first wirings WL1 may be formed at the same time by using the same material as the source electrode SE, the drain electrode DE, or the lower first power voltage line PL located on the main island 101. The first wirings WL1 may include a conductive material including molybdenum (Mo), aluminum (Al), copper (Cu), or titanium (Ti), and may have a single or multi-layer structure including the above material. The first wirings WL1 may be a scan line and/or an emission control line. The first wirings WL1 may extend to the main island 101 to be connected to wirings located on different layers from each other, and may transmit signals to the pixel circuit PC.

The first organic insulating layer 209 may be located to cover the first wirings WL1 on the first sub-island 105*a* and the first connecting unit 103*a*. The first power voltage line PL1 and the first connection wiring CWL1 may be located on the first organic insulating layer 209. The first connection wiring CWL1 may be connected, through the first connection electrode CM1, to the first electrode 221 of the first light-emitting element ED1 on the first sub-island 105*a*. The first power voltage line PL1 may overlap a plurality of first wirings WL1 in a plan view.

The second organic insulating layer 211 may be located to cover the first power voltage line PL1 and the first connection wiring CWL1. The second power voltage line PL2 and the first connection electrode CM1 may be located on the second organic insulating layer 211. The second power voltage line PL2 may overlap the first power voltage line PL1 in a plan view. The third organic insulating layer 213 may be located on the second power voltage line PL2 and the first connection electrode CM1.

The first light-emitting element ED1 may be located on the third organic insulating layer 213 on the first sub-island 105*a*. Because a configuration of the first light-emitting element ED1 is similar to the configuration of the third light-emitting element ED3, the description of the first light-emitting element ED1 may apply to the third light-emitting element ED3. The first electrode 221 of the first light-emitting element ED1 may be connected to the first connection electrode CM1 to be connected to the first connection wiring CWL1. The first light-emitting element ED1 may overlap the first wirings WL1 in a plan view. The first light-emitting element ED1 may be sealed by the encapsulation layer 300.

The first inorganic encapsulation layer 310 and the second inorganic encapsulation layer 330 may be connected to each other at an edge of the sub-island 105, and may be formed to cover a side surface of the sub-island 105. A dam structure and/or a recess structure for controlling the flow of the organic encapsulation layer 320 may be further provided at an edge of the sub-island 105.

The contact area CTA may be located on the first connecting unit 103*a*. The contact area CTA may be an area where the second electrode 223 and the second power voltage line PL2 are connected. The third organic insulating layer 213 may define a contact hole through which the second power voltage line PL2 is exposed in the contact area CTA. A connection electrode CM" may be located on the third organic insulating layer 213, and the connection electrode CM" may be connected to the second power voltage line PL2 through the contact hole formed in the third organic insulating layer 213. The second electrode 223 may be located on the third organic insulating layer 213, and may be connected to the second power voltage line PL2 through the connection electrode CM". The connection electrode CM" may be formed of the same material as the first electrode 221. The connection electrode CM" may be omitted.

The first inorganic encapsulation layer 310 and the second inorganic encapsulation layer 330 may be located on the second electrode 223 on the first connecting unit 103*a*. The first inorganic encapsulation layer 310 and the second inorganic encapsulation layer 330 may surround a side surface of the through-portion V. Although not shown, the pixel-defining film 215 may be further located between the third organic insulating layer 213 and the second electrode 223, and a capping layer may be further located between the second electrode 223 and the first inorganic encapsulation layer 310.

Figure 14:
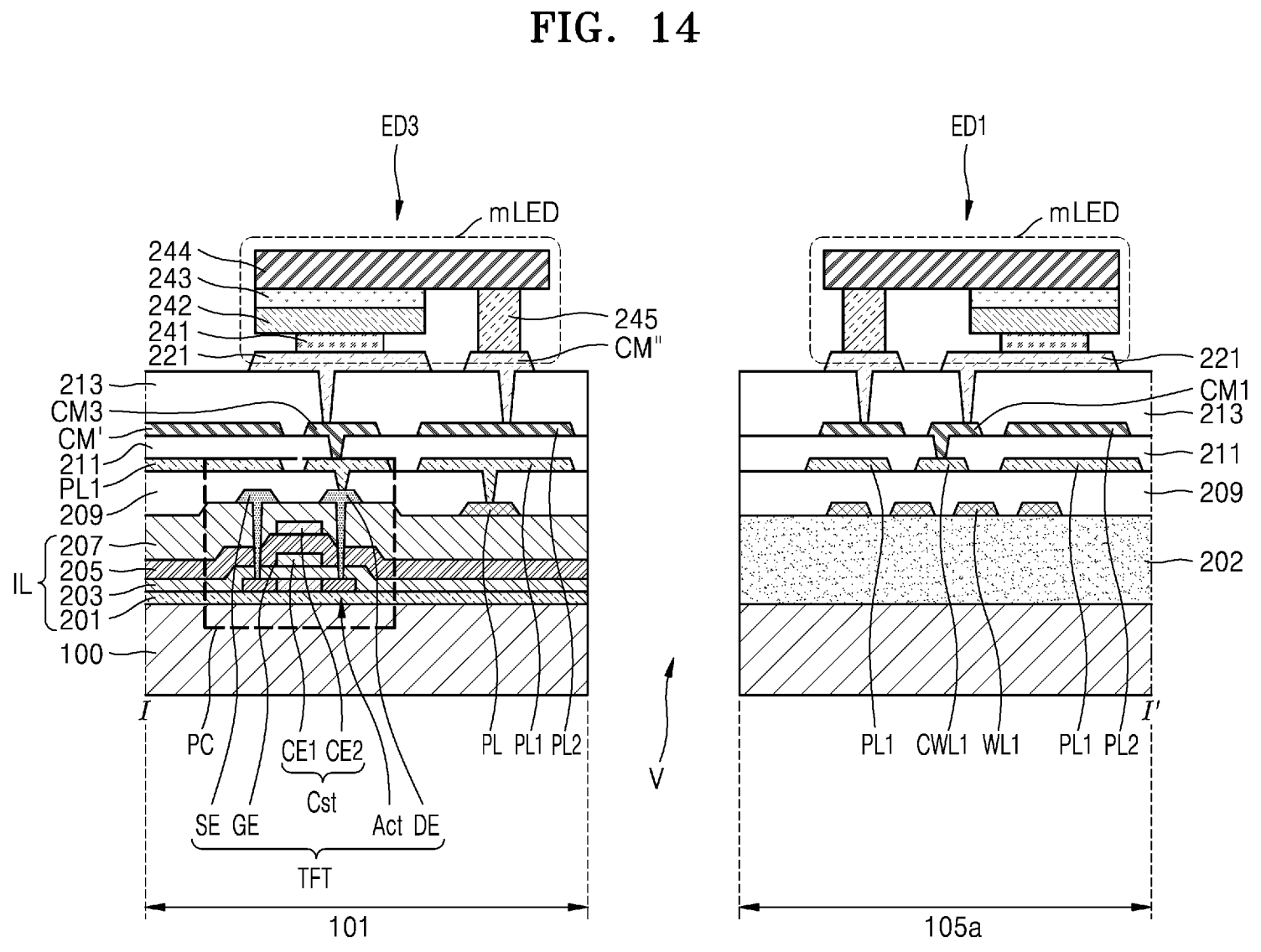

FIG. 14 is a cross-sectional view schematically illustrating a display apparatus, according to another embodiment. In FIG. 14, the same reference numerals as those in FIGS. 12 and 13 denote the same members. In the present embodiment, the first and third light-emitting elements ED1 and ED3 may be micro-light-emitting elements mLED. The micro-light-emitting element mLED may be a micro-light-emitting diode.

The micro-light-emitting element mLED may include a first electrode pad 241, a first semiconductor layer 242, an active layer 243, a second semiconductor layer 244, and a second electrode pad 245. The first electrode pad 241 and a second electrode pad 245 may be electrically connected to the first electrode 221 and the connection electrode CM", respectively, by a conductive assembly (not shown).

The first semiconductor layer 242 may be, for example, a p-type semiconductor layer. The first semiconductor layer 242 may be formed of a semiconductor material having a composition formula of $In_xAl_yGa_{1-x-y}N$ ($0 \le x \le 1$, $0 \le y \le 1$, $0 \le x+y \le 1$) selected from among, for example, GaN, AlN, AlGaN, InGaN, InN, InAlGaN, or AlInN, and may be doped with a p-type dopant such as Mg, Zn, Ca, Sr, or Ba.

The second semiconductor layer 244 may be an n-type semiconductor layer. The second semiconductor layer 244 may be formed of a semiconductor material having a composition formula of $In_xAl_yGa_{1-x-y}N$ ($0 \le x \le 1$, $0 \le y \le 1$, $0 \le x+y \le 1$), selected from among, for example, GaN, AlN, AlGaN, InGaN, InN, InAlGaN, or AlInN, and may be doped with an n-type dopant such as Si, Ge, or Sn.

Doping types of the first semiconductor layer 242 and the second semiconductor layer 244 are examples and are not limited thereto. For another example, the first semiconductor layer 242 may be an n-type semiconductor layer and the second semiconductor layer 244 may be a p-type semiconductor layer.

The active layer 243 may be an area where electrons and holes recombine to change to a lower energy level and generate light having a corresponding wavelength. The active layer 243 may include a semiconductor material having a composition formula of $In_xAl_yGa_{1-x-y}N$ ($0 \le x \le 1$, $0 \le y \le 1$, $0 \le x+y \le 1$), and may have a single or multi-quantum well ("MQW") structure. Also, the active layer 243 may have a quantum wire structure or a quantum dot structure.

The micro-light-emitting element mLED may be a flip-type micro-light-emitting element. The first electrode pad 241 and the second electrode pad 245 of the micro-light-emitting element mLED may face the same surface. Each of the first electrode pad 241 and the second electrode pad 245 may include a metal. In an embodiment, each of the first electrode pad 241 and the second electrode pad 245 may include tin (Sn), silver (Ag), copper (Cu), and/or an alloy thereof. The first electrode pad 241 and the second electrode pad 245 may include the same material or different materials. In some embodiments, each of the first electrode pad 241 and the second electrode pad 245 may include an alloy having the highest content of tin (Sn) and decreasing content in the order of silver (Ag) and copper (Cu).

The first electrode pad 241 may be electrically connected to the first electrode 221 to be connected to the pixel circuit PC. The second electrode pad 245 may be electrically connected to the connection electrode CM" to be connected to the second power voltage line PL2.

Figure 15:
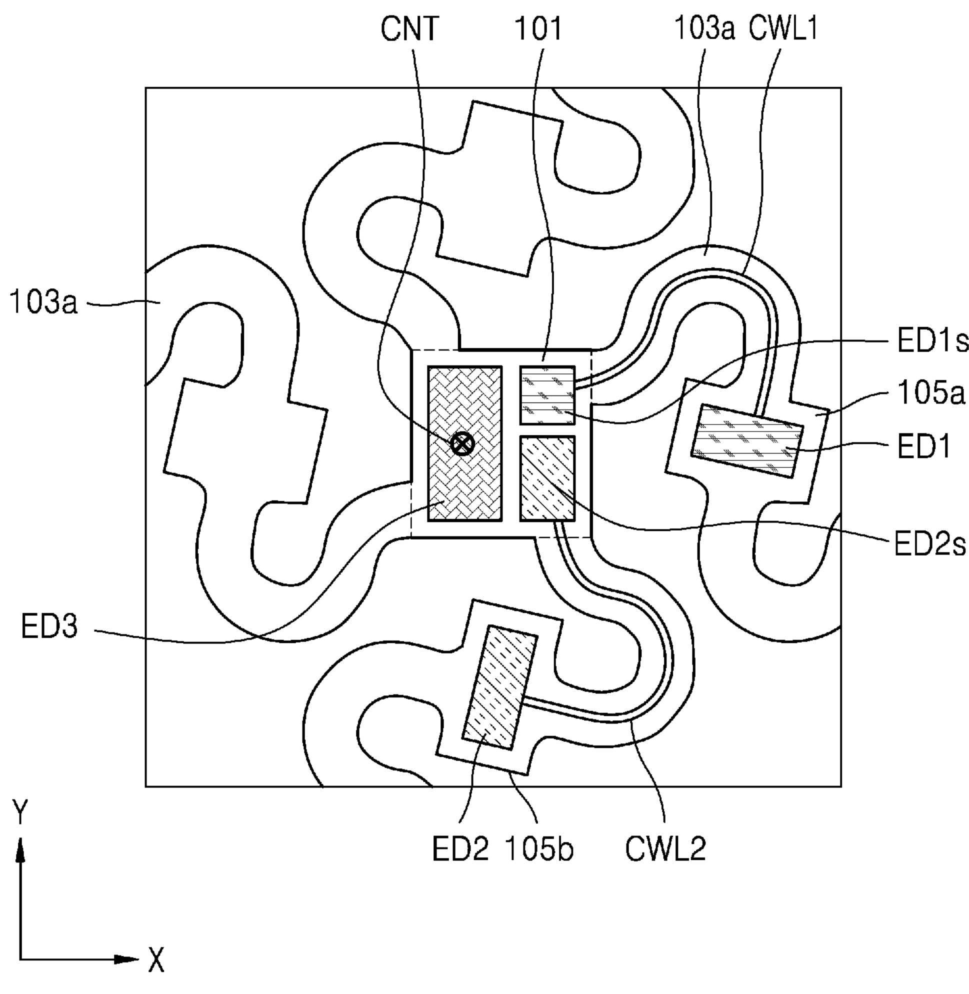
FIG. 15 is a plan view illustrating a connection relationship between a pixel circuit and a light-emitting element of a display apparatus which may be modified, according to another embodiment.
Figure 16:
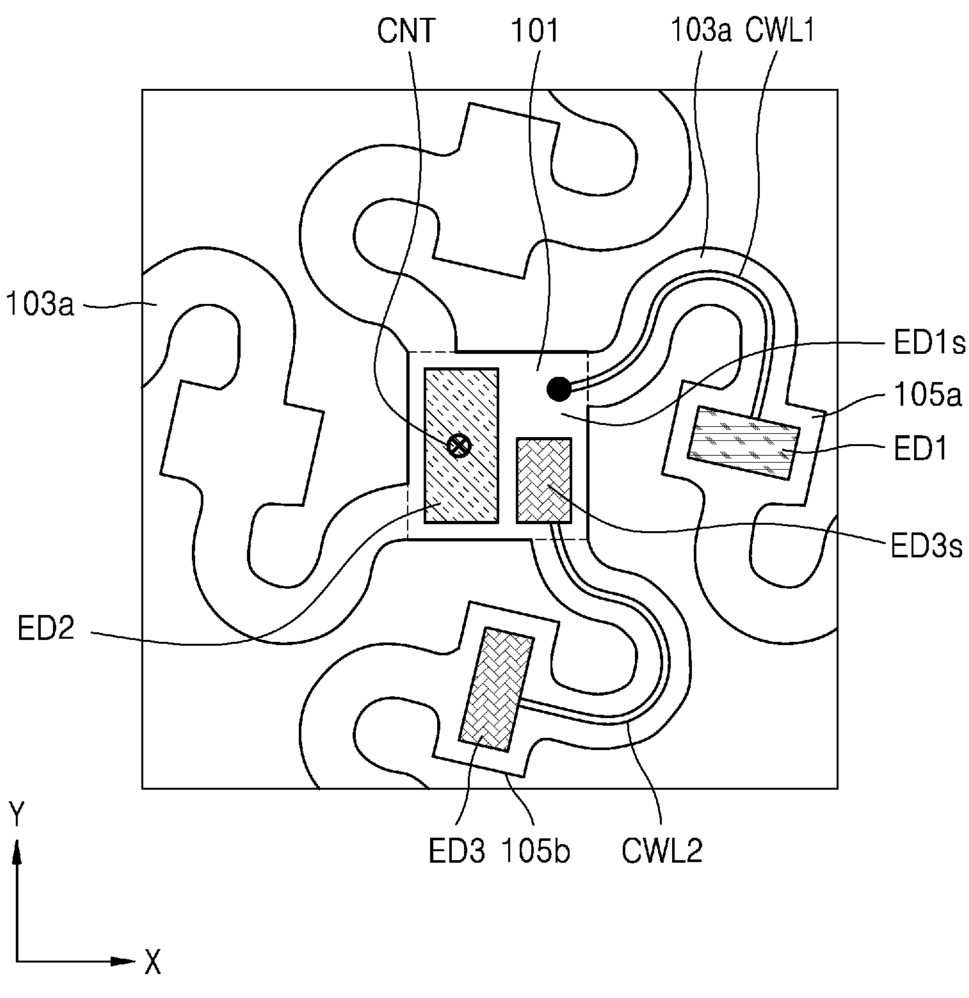
FIG. 16 is a plan view illustrating a connection relationship between a pixel circuit and a light-emitting element of a display apparatus which may be modified, according to still another embodiment.

FIGS. 15 and 16 are plan views illustrating a connection relationship between a pixel circuit and a light-emitting element of a display apparatus which may be modified, according to an embodiment.

Referring to FIGS. 15 and 16, the display apparatus may further include a sub-light-emitting element connected to the same pixel circuit as at least one of the first light-emitting element ED1, the second light-emitting element ED2, and the third light-emitting element ED3.

Referring to FIG. 15, a first sub-light-emitting element ED1*s* may be connected to the same first pixel circuit PC1 as the first light-emitting element ED1. The first sub-light-emitting element ED1*s* may implement a copy pixel of the first light-emitting element ED1. The first sub-light-emitting element ED1*s* may implement a sub-pixel of the same color as the first light-emitting element ED1. The first sub-light-emitting element ED1*s* may be located on the main island 101, and the first sub-light-emitting element ED1*s* and the first light-emitting element ED1 may be connected to each other by the first connection wiring CWL1.

A second sub-light-emitting element ED2*s* may be connected to the same second pixel circuit PC2 as the second light-emitting element ED2. The second sub-light-emitting element ED2*s* may implement a copy pixel of the second light-emitting element ED2. The second sub-light-emitting element ED2*s* may implement a sub-pixel of the same color as the second light-emitting element ED2. The second sub-light-emitting element ED2*s* may be located on the main island 101, and the second sub-light-emitting element ED2*s* and the second light-emitting element ED2 may be connected to each other by the second connection wiring CWL2.

Accordingly, the first sub-light-emitting element ED1*s*, the second sub-light-emitting element ED2*s*, and the third light-emitting element ED3 which implement sub-pixels of different colors may be located on the main island 101. Also, the first light-emitting element ED1 may be located on the first sub-island 105*a*, and the second light-emitting element ED2 may be located on the second sub-island 105*b*. In this structure, five sub-pixels may be implemented by using three pixel circuits.

In some embodiments, the first light-emitting element ED1 and the first sub-light-emitting element ED1*s* may implement a red pixel, the second light-emitting element ED2 and the second sub-light-emitting element ED2*s* may implement a green pixel, and the third light-emitting element ED3 may implement a blue pixel.

Referring to FIG. 16, the second light-emitting element ED2 may be located on the main island 101, and the third light-emitting element ED3 may be located on the second sub-island 105*b*. Also, the display apparatus may further include a third sub-light-emitting element ED3*s*. The third sub-light-emitting element ED3*s* may be connected to the same third pixel circuit PC3 as the third light-emitting element ED3. The third sub-light-emitting element ED3*s* may implement a copy pixel of the third light-emitting element ED3. The third sub-light-emitting element ED3*s* may implement a sub-pixel of the same color as the third light-emitting element ED3. The third sub-light-emitting element ED3*s* may be located on the main island 101, and the third sub-light-emitting element ED3*s* and the third light-emitting element ED3 may be connected to each other by the second connection wiring CWL2. In this structure, four sub-pixels may be implemented by using three pixel circuits.

Figure 17:
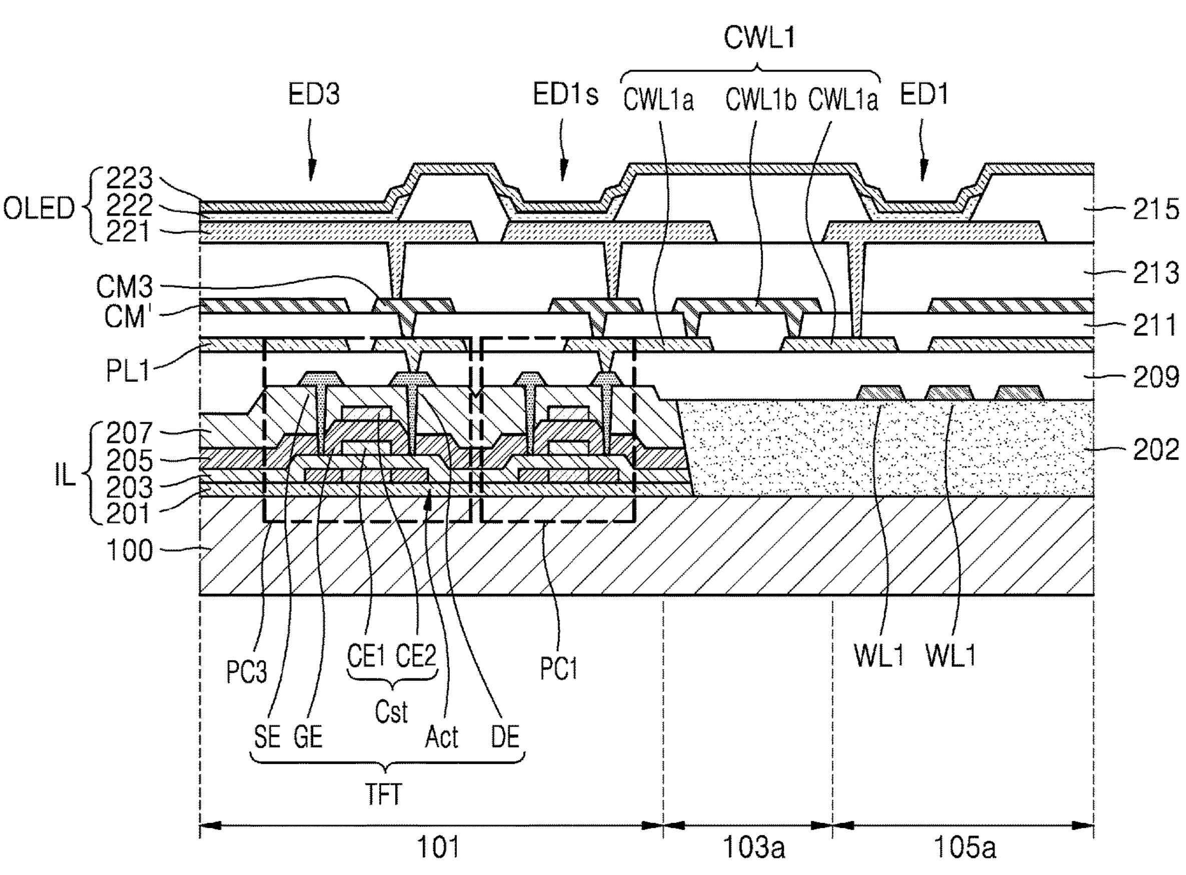
FIG. 17 is a schematic cross-sectional view illustrating modified examples of a connection wiring, according to an embodiment.
Figure 18:
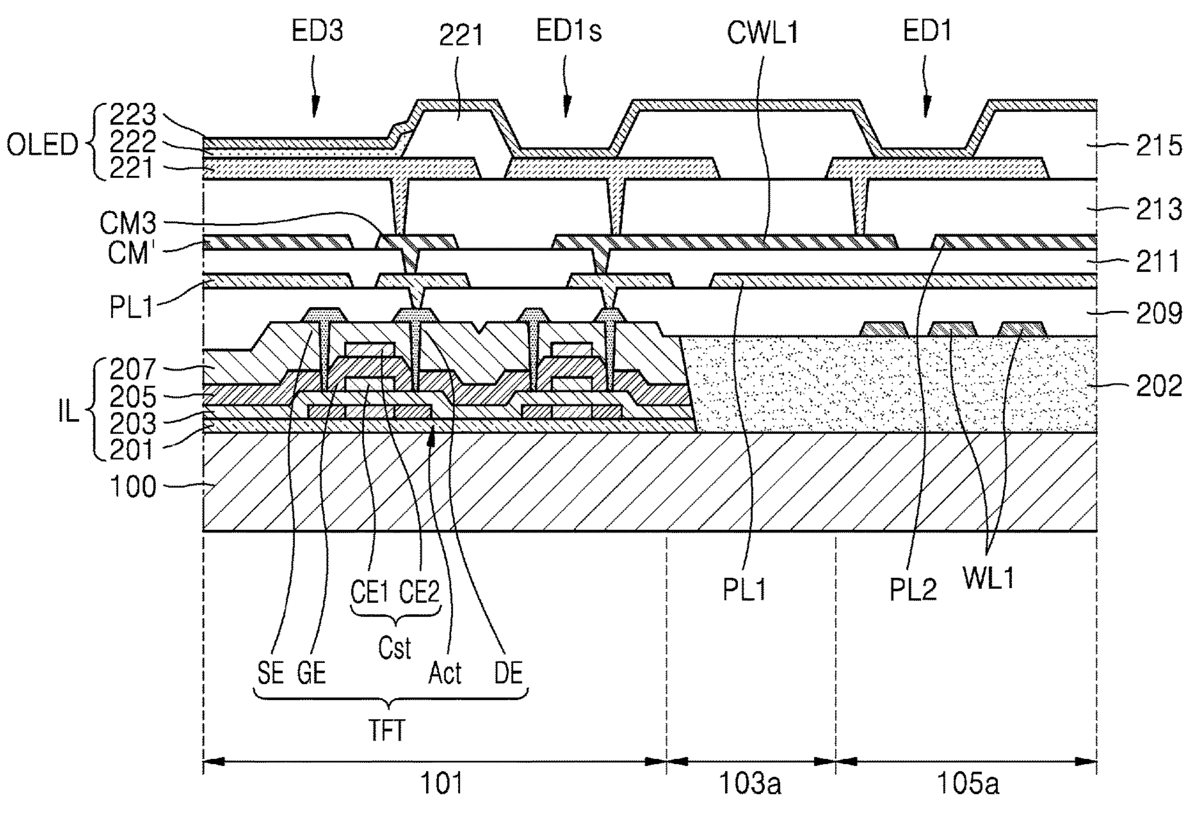
FIG. 18 is a schematic cross-sectional view illustrating modified examples of a connection wiring, according to an embodiment.
Figure 19:
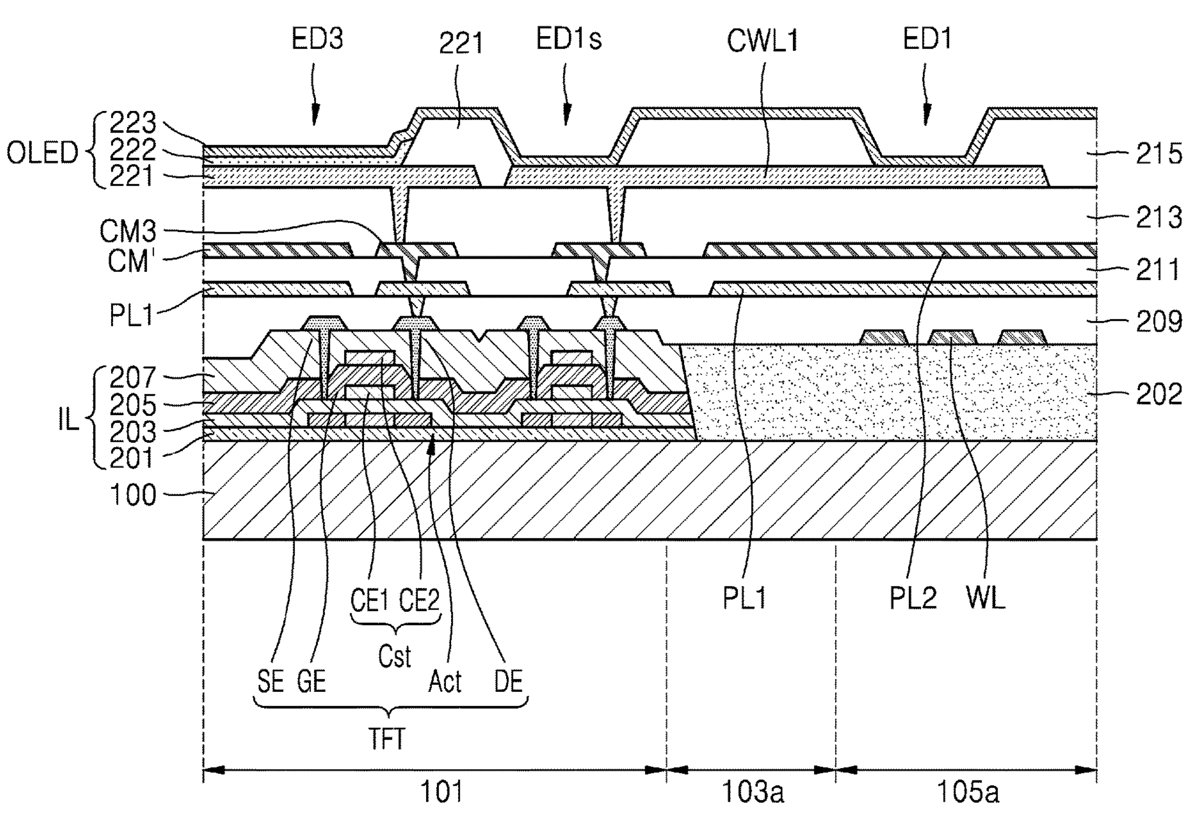
FIG. 19 is a schematic cross-sectional view illustrating modified examples of a connection wiring, according to an embodiment.

FIGS. 17 to 19 are schematic cross-sectional views illustrating modified examples of a connection wiring, according to embodiments.

Referring to FIGS. 17 to 19, the first pixel circuit PC1, the third pixel circuit PC3, the first sub-light-emitting element ED1*s* connected to the first pixel circuit PC1, and the third light-emitting element ED3 connected to the third pixel circuit PC3 may be located on the main island 101. The first light-emitting element ED1 connected to the first pixel circuit PC1 may be located on the first sub-island 105*a*.

The first sub-light-emitting element ED1*s* and the first light-emitting element ED1 may be connected to each other by the first connection wiring CWL1. The first connection wiring CWL1 may be located on the first connecting unit 103*a*.

Referring to FIG. 17, the first connection wiring CWL1 may be provided by connecting conductive layers located on different layers from each other. In an embodiment, for example, the first connection wiring CWL1 may include a 1-1 connection wiring CWL1*a* located on the first organic insulating layer 209 and a 1-2 connection wiring CWL1*b* located on the second organic insulating layer 211. The 1-1 connection wiring CWL1*a* and the 1-2 connection wiring CWL1*b* may be connected to each other through a contact hole in the first connecting unit 103*a*. In this structure, interference with other wirings may be avoided.

Referring to FIG. 18, the first connection wiring CWL1 that is a conductive layer located on the second organic insulating layer 211 may continuously extend on the first connecting unit 103*a*. In another embodiment, the first connection wiring CWL1 that is a conductive layer located on the organic material layer 202 or a conductive layer (e.g., the first power voltage line PL1) located on the first organic insulating layer 209 may continuously extend on the first connecting unit 103*a*.

Referring to FIG. 19, the first connection wiring CWL1 may be provided as a conductive layer located on the third organic insulating layer 213. The first connection wiring CWL1 may be provided by extending the first electrode 221 of the first sub-light-emitting element ED1*s*.

Figure 20:
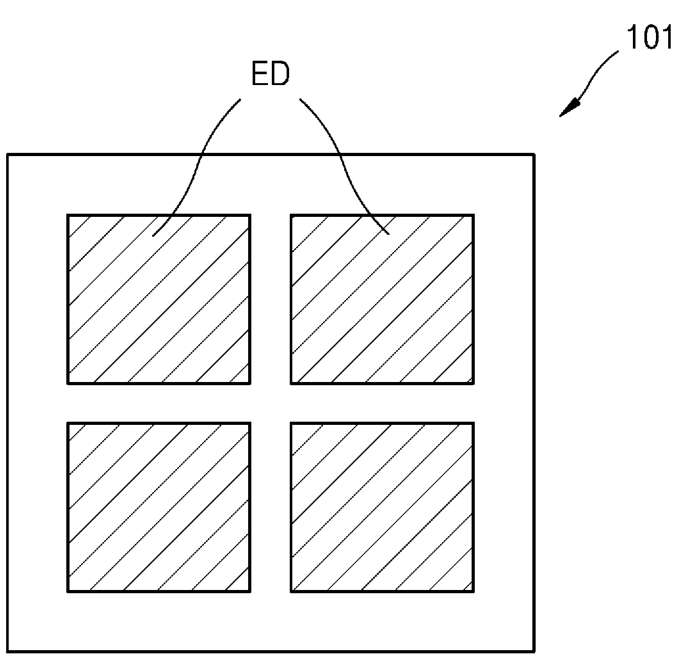
FIG. 20 is a plan view illustrating a part of a display apparatus, according to embodiments.

FIG. 20 is a plan view illustrating a part of a display apparatus, according to embodiments. In detail, FIG. 20 illustrates a light-emitting element located on a main island of a substrate.

Referring to FIG. 20, a plurality of light-emitting elements ED for emitting light of the same color may be located on the main island 101. When the light-emitting element ED is a micro-light-emitting element, the light-emitting element ED may have a very small size, and thus, a plurality of light-emitting elements ED may be provided on the main island 101. The plurality of light-emitting elements ED may be connected to one pixel circuit. The number of light-emitting elements ED may be determined in consideration of light efficiency.

Figure 21:
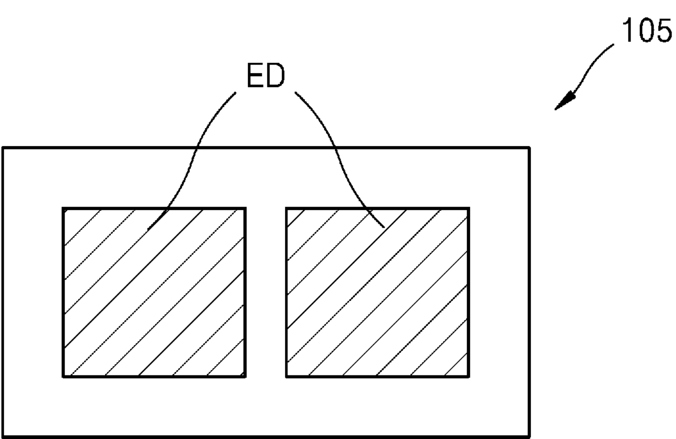
FIG. 21 is a plan view illustrating a part of a display apparatus, according to embodiments.

FIG. 21 is a plan view illustrating a part of a display apparatus, according to embodiments. In detail, FIG. 21 illustrates a light-emitting element located on a sub-island of a substrate.

Referring to FIG. 21, a plurality of light-emitting elements ED for emitting light of the same color may be located on the sub-island 105. When the light-emitting element ED is a micro-light-emitting element, the light-emitting element ED may have a very small size, and thus, a plurality of light-emitting elements ED may be provided on the sub-island 105. The plurality of light-emitting elements ED may be connected to one pixel circuit. The number of light-emitting elements ED may be determined in consideration of light efficiency of the light-emitting elements ED. Accordingly, the number of red light-emitting elements ED, the number of green light-emitting elements ED, and the number of blue light-emitting elements ED located on one sub-island 105 may be different.

Figure 22:
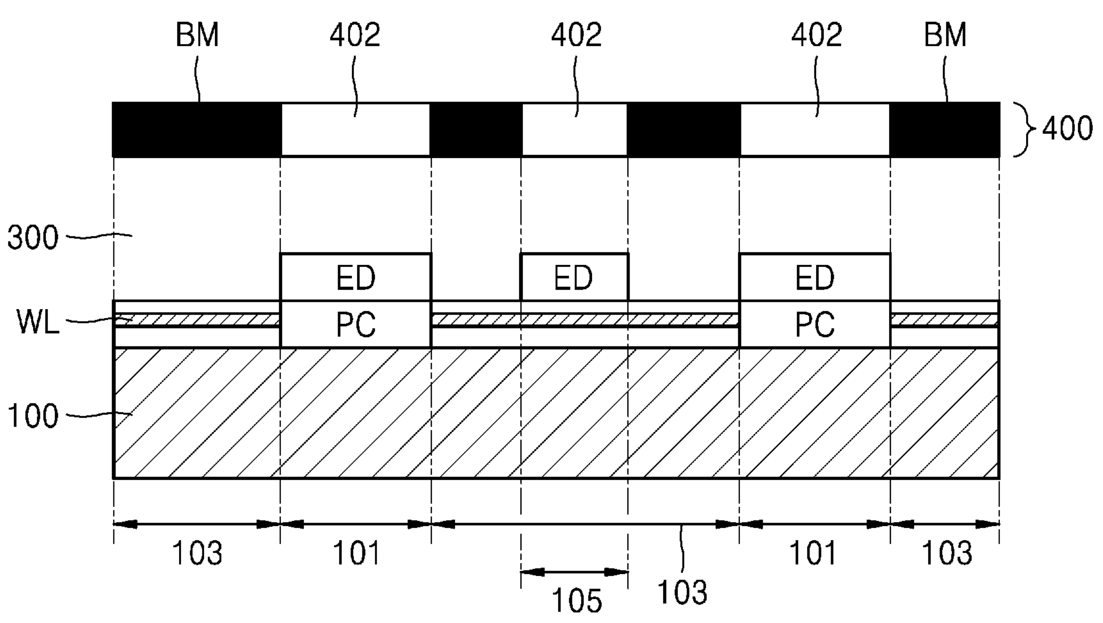
FIG. 22 is a cross-sectional view schematically illustrating a display apparatus, according to an embodiment.

FIG. 22 is a cross-sectional view schematically illustrating a display apparatus, according to an embodiment.

Referring to FIG. 22, the display apparatus according to the disclosure includes the substrate 100 including the main island 101, the sub-island 105, and the connecting unit 103, the pixel circuit PC located on the main island 101, the light-emitting elements ED located on the main island 101 and the sub-island 105, and the wirings WL located on the connecting unit 103. The light-emitting element ED may be sealed by the encapsulation layer 300.

In the present embodiment, the display apparatus may further include an optical functional layer 400. The optical functional layer 400 may include a color conversion layer 402 and a light blocking unit BM. In some embodiments, the color conversion layer 402 may be a color filter. The color conversion layer 402 may include a red color filter, a green color filter, and a blue color filter corresponding to red, green, and blue sub-pixels, respectively. The color conversion layer 402 may overlap the main island and the sub-island in a plan view.

The light blocking unit BM may be located to correspond to a portion where a sub-pixel is not located. The light blocking unit BM may overlap at least a part of the connecting unit 103 in a plan view. The light blocking unit BM may include at least one of a black pigment, a black dye, and black particles. In some embodiments, the light blocking unit BM may include a material such as Cr or $CrO_X$, $Cr/CrO_X$, $Cr/CrO_X/CrN_Y$, a resin (carbon pigment, RGB mixed pigment), graphite, or a non-Cr based material.

The color conversion layer 402 may include quantum dots. The quantum dots may exhibit unique excitation and emission characteristics according to materials and sizes, and thus, may convert incident light into certain color light.

A quantum dot may be selected from among a group II-VI compound, a group III-V compound, a group IV-VI compound, a group IV element, a group IV compound, and a combination thereof. Also, a quantum dot has a size and a shape that is generally used in the art and is not specifically limited. More specifically, a quantum dot may have a spherical shape, a pyramidal shape, a multi-arm shape, a cubic nanoparticle shape, a nanotube shape, a nanowire shape, a nanofiber shape, or a nanoplate particle shape.

According to the present embodiment, when the optical functional layer 400 is applied to the display apparatus, the light-emitting elements ED may be provided as light-emitting elements that emit light of one color. In an embodiment, for example, all of the light-emitting elements ED may emit blue light. However, the disclosure is not limited thereto. Even when the optical functional layer 400 is applied, the light-emitting elements ED may emit red, green, and blue light for each position of each sub-pixel.

As described above, according to embodiments, because a light-emitting element located on a sub-island and connected to a pixel circuit located on a main island, even when a display apparatus is stretched or contracted, visibility may be ensured and an aperture ratio of an emission area may be ensured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a substrate comprising main islands arranged in a first direction and a second direction, a first connecting unit configured to connect the main islands arranged in the first direction to one another, a second connecting unit configured to connect the main islands arranged in the second direction to one another, a first sub-island located in a middle portion of the first connecting unit, a second sub-island located in a middle portion of the second connecting unit, and a plurality of through-portions defined between the main islands;

a first pixel circuit, a second pixel circuit, and a third pixel circuit located on each of the main islands;

a first light-emitting element located on the first sub-island and connected to the first pixel circuit;

a first connection wiring located on the first connecting unit and configured to connect the first pixel circuit to the first light-emitting element; and first wirings located on the first connecting unit.

2. The display apparatus of claim 1, further comprising:

a second light-emitting element located on the second sub-island and connected to the second pixel circuit; and a third light-emitting element located on each of the main islands and connected to the third pixel circuit, wherein the first light-emitting element, the second light emitting element, and the third light-emitting element emit light of different colors from each other.

3. The display apparatus of claim 2, wherein a size of a third sub-pixel implemented by the third light-emitting element is greater than a size of a first sub-pixel implemented by the first light-emitting element in a plan view.

4. The display apparatus of claim 2, wherein the third light-emitting element at least partially overlaps the first pixel circuit in a plan view.

5. The display apparatus of claim 1, wherein the first connecting unit comprises a first portion being convex in a third direction and a second portion being convex in a fourth direction opposite to the third direction in a plan view, wherein the first sub-island is located between the first portion and the second portion.

6. The display apparatus of claim 1, further comprising second wirings located on the second connecting unit, wherein the first wirings and the second wirings are located in a same layer.

7. The display apparatus of claim 6, wherein at least one of the first wirings is a scan line through which a scan signal is transmitted, and at least one of the second wirings is a data line through which a data signal is transmitted.

8. The display apparatus of claim 1, further comprising a first power voltage line located on each of the main islands, the first connecting unit, and the second connecting unit, wherein the first connection wiring and the first power voltage line are located in a same layer.

9. The display apparatus of claim 1, further comprising:

a second light-emitting element located on the second sub-island and connected to the second pixel circuit;

second wirings configured to provide a data signal to the first pixel circuit, the second pixel circuit, and the third pixel circuit; and a second connection wiring located on the second connecting unit and configured to connect the second pixel circuit to the second light-emitting element, wherein the second connection wiring and the second wirings are located in a same layer.

10. The display apparatus of claim 1, further comprising a second power voltage line located on each of the main islands, the first connecting unit, and the second connecting unit, wherein a contact area where the second power voltage line and a second electrode of the first light-emitting element are connected to each other is located on the first connecting unit.

11. The display apparatus of claim 1, wherein the first light-emitting element is an organic light-emitting element.

12. The display apparatus of claim 1, wherein the first light-emitting element is a micro-light-emitting element.

13. The display apparatus of claim 1, further comprising a first sub-light-emitting element connected to the first pixel circuit and configured to emit light of a same color as the first light-emitting element, wherein the first sub-light-emitting element is located on each of the main islands.

14. The display apparatus of claim 13, wherein the first connection wiring comprises a 1-1 connection wiring and a 1-2 connection wiring located in different layers from each other in the first connecting unit.

15. The display apparatus of claim 13, further comprising a second power voltage line located on each of the main islands, the first connecting unit, and the second connecting unit, wherein the first connection wiring and the second power voltage line are located in a same layer.

16. The display apparatus of claim 13, wherein the first connection wiring and a first electrode of the first light-emitting element are located in a same layer.

17. The display apparatus of claim 1, wherein a plurality of third light-emitting elements configured to emit light of a same color are provided on each of the main islands.

18. The display apparatus of claim 1, wherein the first light-emitting element is provided in plurality, and the plurality of first light-emitting elements are configured to emit light of a same color.

19. The display apparatus of claim 1, further comprising an optical functional layer located on the first light-emitting element, wherein the optical functional layer comprises a color conversion layer overlapping the first light-emitting element and a light blocking unit overlapping the first connecting unit in a plan view.

20. The display apparatus of claim 19, wherein the color conversion layer comprises quantum dots.

21. A display apparatus comprising:

a substrate comprising a main island, a sub-island spaced apart from the main island, a connecting unit configured to connect the main island to the sub-island, and a plurality of through-portions defined between the main island and the sub-island;

a first pixel circuit and a second pixel circuit located on the main island;

a first light-emitting element located on the main island and at least partially overlapping the first pixel circuit and the second pixel circuit in a plan view; and a second light-emitting element located on the sub-island and connected to the second pixel circuit.

22. The display apparatus of claim 21, wherein a color of a first sub-pixel implemented by the first light-emitting element and a color of a second sub-pixel implemented by the second light-emitting element are different from each other, and a size of the first sub-pixel is greater than a size of the second sub-pixel in the plan view.

23. The display apparatus of claim 21, wherein the connecting unit comprises a curved portion.

24. The display apparatus of claim 21, further comprising a second sub-light-emitting element located on the main island and connected to the second pixel circuit.

25. The display apparatus of claim 21, wherein an area of the sub-island is less than an area of the main island in the plan view.

* * * * *